United States Patent
Osame et al.

(10) Patent No.: US 8,207,916 B2
(45) Date of Patent: Jun. 26, 2012

(54) LIGHT EMITTING DEVICE AND METHOD OF DRIVING THE LIGHT EMITTING DEVICE

(75) Inventors: Mitsuaki Osame, Kanagawa (JP); Aya Anzai, Kanagawa (JP); Yoshifumi Tanada, Kanagawa (JP); Keisuke Miyagawa, Kanagawa (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 930 days.

(21) Appl. No.: 12/243,637

(22) Filed: Oct. 1, 2008

(65) Prior Publication Data

US 2009/0033600 A1    Feb. 5, 2009

Related U.S. Application Data

(63) Continuation of application No. 11/701,346, filed on Feb. 1, 2007, now Pat. No. 7,450,093, which is a continuation of application No. 10/373,772, filed on Feb. 25, 2003, now Pat. No. 7,176,857.

(30) Foreign Application Priority Data

Feb. 28, 2002   (JP) .................................. 2002-054886

(51) Int. Cl.
  *G09G 3/30* (2006.01)
  *G09G 3/32* (2006.01)
(52) U.S. Cl. ........................................... 345/76; 345/82
(58) Field of Classification Search .................... 345/76, 345/77, 82, 83
See application file for complete search history.

(56) References Cited

U.S. PATENT DOCUMENTS

| | | | |
|---|---|---|---|
| 4,523,189 A | 6/1985 | Takahara et al. |
| 4,806,496 A | 2/1989 | Suzuki et al. |
| 4,951,041 A | 8/1990 | Inada et al. |
| 5,414,443 A | 5/1995 | Kanatani et al. |
| 5,552,678 A | 9/1996 | Tang et al. |
| 5,641,991 A | 6/1997 | Sakoh |
| 5,847,516 A | 12/1998 | Kishita et al. |
| 5,882,761 A | 3/1999 | Kawami et al. |
| 5,955,765 A | 9/1999 | Yamazaki et al. |

(Continued)

FOREIGN PATENT DOCUMENTS

EP    0 694 900 A2    1/1996
(Continued)

OTHER PUBLICATIONS

Van Slyke, S.A. et al, "Organic Electroluminescent Devices with Improved Stability," Applied Physics Letters, vol. 69, No. 15, Oct. 7, 1996, pp. 2160-2162.

(Continued)

*Primary Examiner* — Kevin M Nguyen
(74) *Attorney, Agent, or Firm* — Husch Blackwell LLP

(57) ABSTRACT

A light emitting device that achieves long life, and which is capable of performing high duty drive, by suppressing initial light emitting element deterioration is provided. Reverse bias application to an EL element (109) is performed one row at a time by forming a reverse bias electric power source line (112) and a reverse bias TFT (108). Reverse bias application can therefore be performed in synchronous with operations for write-in of an image signal, light emission, erasure, and the like. Reverse bias application therefore becomes possible while maintaining a duty equivalent to that of a conventional driving method.

16 Claims, 16 Drawing Sheets

U.S. PATENT DOCUMENTS

| | | |
|---|---|---|
| 5,990,629 A | 11/1999 | Yamada et al. |
| 6,064,158 A | 5/2000 | Kishita et al. |
| 6,087,245 A | 7/2000 | Yamazaki et al. |
| 6,121,943 A | 9/2000 | Nishioka et al. |
| 6,151,006 A | 11/2000 | Yanagi et al. |
| 6,175,345 B1 | 1/2001 | Kuribayashi et al. |
| 6,373,455 B1 | 4/2002 | Kuribayashi et al. |
| 6,380,689 B1 | 4/2002 | Okuda |
| 6,452,341 B1 | 9/2002 | Yamauchi et al. |
| 6,522,319 B1 | 2/2003 | Yamazaki |
| 6,525,704 B1 | 2/2003 | Kondo et al. |
| 6,529,178 B1 | 3/2003 | Kimura |
| 6,531,827 B2 | 3/2003 | Kawashima |
| 6,661,180 B2 | 12/2003 | Koyama |
| 6,750,833 B2 | 6/2004 | Kasai |
| 6,809,482 B2 | 10/2004 | Koyama |
| 6,872,973 B1 | 3/2005 | Koyama et al. |
| 6,873,116 B2 | 3/2005 | Kimura et al. |
| 6,909,111 B2 | 6/2005 | Yamagata et al. |
| 6,965,362 B1 | 11/2005 | Ishizuka |
| 7,176,857 B2 | 2/2007 | Osame et al. |
| 7,209,101 B2 | 4/2007 | Abe |
| 2001/0054991 A1 | 12/2001 | Kimura et al. |
| 2002/0042152 A1 | 4/2002 | Yamazaki et al. |
| 2002/0047839 A1 | 4/2002 | Kasai |
| 2002/0113760 A1 | 8/2002 | Kimura |
| 2002/0180671 A1 | 12/2002 | Inukai |
| 2003/0058210 A1 | 3/2003 | Yamazaki et al. |
| 2003/0103022 A1 | 6/2003 | Noguchi et al. |
| 2003/0137503 A1* | 7/2003 | Kimura et al. .................. 345/76 |
| 2003/0160745 A1 | 8/2003 | Osame et al. |
| 2005/0134189 A1 | 6/2005 | Osame et al. |
| 2007/0139315 A1 | 6/2007 | Abe |

FOREIGN PATENT DOCUMENTS

| | | |
|---|---|---|
| EP | 0 704 912 A1 | 4/1996 |
| EP | 0 776 147 A1 | 5/1997 |
| EP | 0 883 191 A2 | 12/1998 |
| EP | 1 094 436 A2 | 4/2001 |
| EP | 1 094 438 A1 | 4/2001 |
| EP | 1 103 946 A2 | 5/2001 |
| EP | 1 288 902 A1 | 3/2003 |
| JP | 64-31197 | 2/1989 |
| JP | 8-78519 | 3/1996 |
| JP | 8-180972 | 7/1996 |
| JP | 9-54566 | 2/1997 |
| JP | 10-41068 | 2/1998 |
| JP | 10-214060 | 8/1998 |
| JP | 10-232649 | 9/1998 |
| JP | 10-312173 | 11/1998 |
| JP | 11-3048 | 1/1999 |
| JP | 2000-347621 | 12/2000 |
| JP | 2001-34231 | 2/2001 |
| JP | 2001-109432 | 4/2001 |
| JP | 2001-142413 | 5/2001 |
| JP | 2001-222255 | 8/2001 |
| JP | 2001-343933 | 12/2001 |
| JP | 2003-122303 | 4/2003 |
| JP | 2003-122304 | 4/2003 |
| JP | 2003-150108 | 5/2003 |
| JP | 2003-195811 | 7/2003 |
| JP | 2003-208127 | 7/2003 |
| TW | 278173 | 6/1996 |
| WO | WO 98/33165 A1 | 7/1998 |

OTHER PUBLICATIONS

Zou, D. et al, "Spontaneous and Reverse-Bias Induced Recovery Behavior in Organic Electroluminescent Diodes," Applied Physics Letters, vol. 72, No. 19, May 11, 1998, pp. 2484-2486.

Zou, D. et al, "Improvement of Current-Voltage Characteristics in Organic Light Emitting Diodes by Application of Reversed-Bias Voltage," Japanese Journal of Applied Physics, vol. 37, part 2, No. 11B, Nov. 15, 1998, pp. L1406-L1408.

European Search Report re application No. EP 00122880.8, dated May 27, 2002.

\* cited by examiner

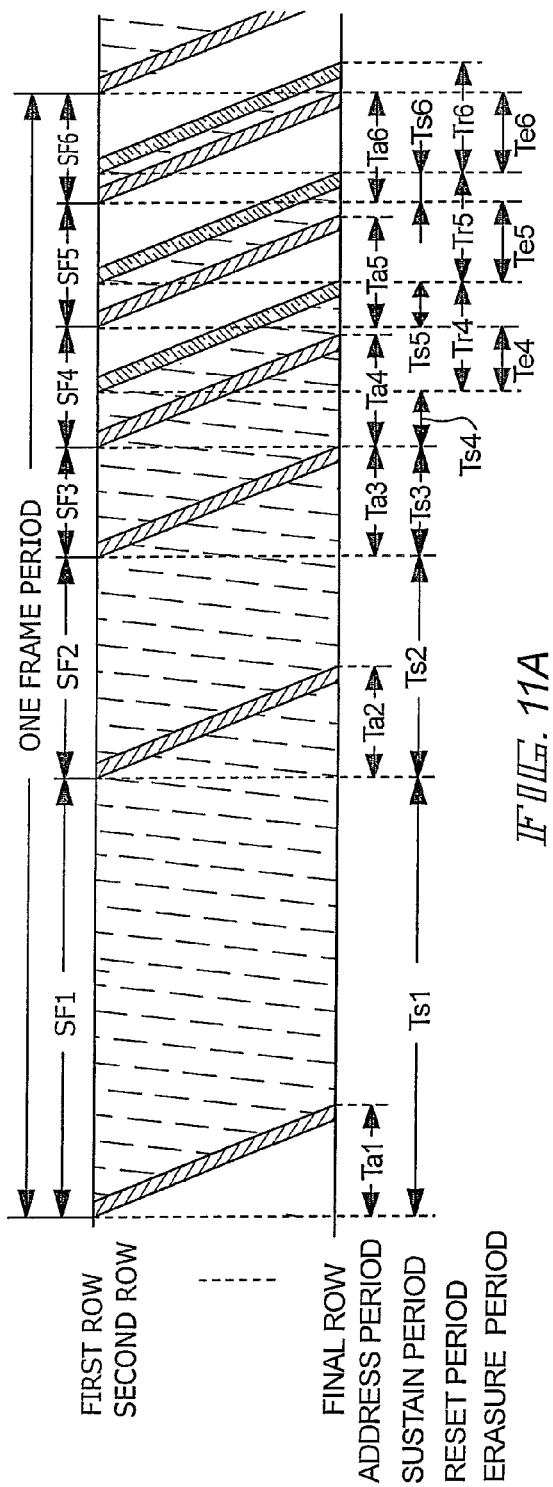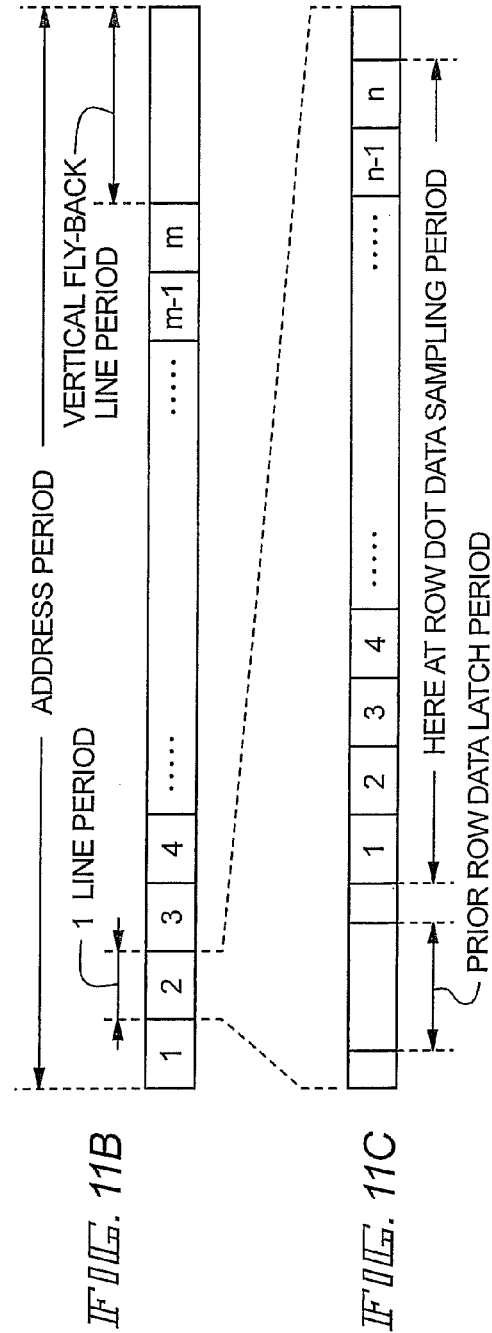

LIGHT EMITTING DEVICE AND METHOD OF DRIVING THE LIGHT EMITTING DEVICE

This application is a continuation of U.S. application Ser. No. 11/701,346 on Feb. 1, 2007 now U.S. Pat. No. 7,450,093 which is a continuation of U.S. application Ser. No. 10/373,772, filed on Feb. 25, 2003 (now U.S. Pat. No. 7,176,857 issued Feb. 13, 2007).

BACKGROUND OF THE INVENTION

1. Field of the Invention

The present invention relates to an electroluminescence (EL) element, and a method of driving a light emitting device manufactured by forming thin-film transistors (hereinafter abbreviated as TFTs) on a substrate. Particularly, the present invention relates to an electronic apparatus which uses the light emitting device as display units. Here, as a typical example of light emitting elements, the EL elements will be described.

In this specification, the EL elements include the ones which utilize emission of light from singlet excitons (fluorescence) and the ones which utilize the emission of light from triplet excitons (phosphorescence).

2. Description of the Related Art

In recent years, light-emitting devices having EL elements as the light emitting elements have been vigorously developed as light emitting elements. Unlike liquid crystal display devices, the light-emitting device is of self emission type. The EL element has a structure in which an EL layer is held between a pair of electrodes (anode and cathode), the EL layer being, usually, of a laminated-layer structure. Typically, there can be exemplified a laminated-layer structure of "positive hole-transporting layer/light-emitting layer/electron-transporting layer" proposed by Tang et al. of Eastman Kodak Co. This structure features a very high light-emitting efficiency, and the EL display devices that have now been studied and developed have almost all been employing this structure.

There can be further exemplified a structure in which a positive hole-injecting layer, a positive hole-transporting layer, a light-emitting layer and an electron-transporting layer are laminated in this order on the anode, or a structure in which the positive hole-injecting layer, the positive hole-transporting layer, the light-emitting layer, the electron-transporting layer and the electron-injecting layer are laminated thereon this order. The light-emitting layer may further be doped with a fluorescent pigment or the like pigment.

Here, the layers provided between the cathode and the anode are all referred generally as an EL layer. Therefore, the above positive hole-injecting layer, positive hole-transporting layer, light-emitting layer, electron-transporting layer and electron-injection layer are all included in the EL layer.

A predetermined voltage is applied across the pair of electrodes (both electrodes) holding the EL layer of the above structure therein, whereby the carriers are recombined in the light-emitting layer to thereby emit light. At this time, the light emitting brightness of the EL element is proportional to a current flowing to the EL element.

Brightness changes in a light emitting device that uses EL elements due to deterioration of the elements themselves, even if a fixed current flows. If this kind of deterioration develops and the EL elements are used as a light emitting device, then display pattern burn-in develops, and correct gray scale display becomes impossible to perform.

In particular, brightness changes due to deterioration of the EL elements themselves during their initial switch-on period, referred to as "initial deterioration", are remarkable. A method of applying a reverse bias to the EL elements in order to suppress deterioration of the EL elements themselves has been proposed in JP 2001-109432 A, JP 2001-222255 A, and the like. A state in which a voltage is applied between an anode and a cathode so that electric current flows in an EL element, namely a state in which the electric potential of the anode is higher than the electric potential of the cathode, is taken as a forward bias here. Conversely, a state in which the electric potential of the cathode is higher than the electric potential of the anode is taken as a reverse bias. If a forward bias is applied, electric current flows in the EL element according to the voltage and the EL element emits light. Electric current does not flow in the EL element and the EL element does not emit light, if a reverse bias is applied.

In addition, a driving method in which a bias applied to an EL element is periodically switched between a forward bias and a reverse bias is defined as alternating current drive here.

Passive matrix and active matrix types exist as light emitting device types, and active matrix light emitting devices are suitable for displays that demand high speed operation because of an increase in the number of pixels that accompanies higher resolution, or in order to perform dynamic display.

Further, a digital time gray scale method, which is not easily influenced by dispersion in the characteristics of driver TFTs, is available as a method of driving an active matrix light emitting device.

In addition, a high precision, multi-gray scale display can be achieved by using an erasure TFT, in addition to a driver TFT and a switching TFT, within each pixel with a digital time gray scale method, as disclosed by JP 2001-343933 A. This driving method is hereinafter referred to as SES (simultaneous erase scan) drive within this specification.

If the EL elements themselves deteriorate, then a difference in the brightness of each of the pixels develops as discussed above corresponding to the degree of deterioration, a display pattern becomes burned in, and correct gray scale display becomes impossible to perform.

SUMMARY OF THE INVENTION

An object of the present invention is to propose a specific pixel structure and driving method for cases in which SES drive is employed in an active matrix EL panel, and in addition, for cases in which a reverse bias is applied in order to reduce deterioration of EL elements.

The present invention has a feature in which a reverse bias is applied to an EL element without making the electric potential of either the anode or the cathode rise or fall. Specifically, application of a reverse bias by a conventional method is performed by changing an electric power source potential, and therefore the voltage endurance of TFTs structuring other portions tends to become a problem following the changes in the electric power source potential. In the present invention, a novel electric power source line having an electric potential used for a reverse bias is formed, and the timing at which the reverse bias is applied is determined by dedicated TFTs turning on and off. In addition, it becomes possible to determine the timing at which the reverse bias is applied row by row with the dedicated TFTs. A reverse bias period can therefore be prepared in synchronism with an erasure period in each line, and a high duty ratio can be achieved.

Additionally, a sufficient effect in preventing deterioration caused by applying the reverse bias can be obtained by making the reverse bias smaller than a forward bias, and a structure can be made in which electric current consumption, voltage endurance of the TFTs and the EL elements, and the like do not cause problems.

The structure of the present invention is described hereinbelow.

A light emitting device according to the present invention includes:
a panel having:
a pixel portion in which a plurality of pixels are arranged in matrix;
a source signal line driver circuit for driving the pixel portion; and
a gate signal line driver circuit for driving the pixel portion;
a first means for generating a timing signal and an image signal for driving the source signal line driver circuit and the gate signal line driver circuit; and
a second means for supplying a desired electric power source used in the panel,
each pixel of the plurality of pixels having:
a light emitting element having a first electrode and a second electrode;
a third means for controlling input of the image signal to the pixel;
a fourth means for determining whether the light emitting element emits light or does not emit light, in accordance with the input image signal, for applying a forward bias between the first electrode and the second electrode of the light emitting element when the light emitting element emits light, and for supplying an electric current;
a fifth means for forcibly cutting off the electric current supplied to the light emitting element; and
a sixth means for controlling the timing at which a reverse bias is applied between the first electrode and the second electrode of the light emitting element.

The first means and the second means may also be integrated with the panel here. In addition, the third means, the fourth means, the fifth means, and the sixth means may be means in which conductivity and non-conductivity can be selected by using an image signal as a control signal.

A light emitting device according to the present invention includes a plurality of pixels, each pixel of the plurality of pixels having:
a source signal line;
a first gate signal line;
a second gate signal line;
a third gate signal line;
a first electric power source line;
a second electric power source line;
a third electric power source line;
a first transistor having a gate electrode, a first electrode, and a second electrode;
a second transistor having a gate electrode, a first electrode, and a second electrode;
a third transistor having a gate electrode, a first electrode, and a second electrode;
a fourth transistor having a gate electrode, a first electrode, and a second electrode; and
a light emitting element having a first electrode and a second electrode,
in which:
the gate electrode of the first transistor is electrically connected to the first gate signal line, the first electrode of the first transistor is electrically connected to the source signal line, and the second electrode of the first transistor is electrically connected to the first electrode of the second transistor and the gate electrode of the third transistor;
the gate electrode of the second transistor is electrically connected to the second gate signal line, and the second electrode of the second transistor is electrically connected to the first power source line;
the first electrode of the third transistor is electrically connected to the first power source line, and the second electrode of the third transistor is electrically connected to the first electrode of the light emitting element and the first electrode of the fourth transistor;
the gate electrode of the fourth transistor is electrically connected to the third gate signal line, and the second electrode of the fourth transistor is electrically connected to the second electric power source line; and
the second electrode of the light emitting element is electrically connected to the third electric power source line.

A light emitting device according to the present invention includes a plurality of pixels, each pixel of the plurality of pixels having:
a source signal line;
a first gate signal line;
a second gate signal line;
a first electric power source line;
a second electric power source line;
a third electric power source line;
a first transistor having a gate electrode, a first electrode, and a second electrode;
a second transistor having a gate electrode, a first electrode, and a second electrode;
a third transistor having a gate electrode, a first electrode, and a second electrode;
a fourth transistor having a gate electrode, a first electrode, and a second electrode; and
a light emitting element having a first electrode and a second electrode,
in which:
the gate electrode of the first transistor is electrically connected to the first gate signal line, the first electrode of the first transistor is electrically connected to the source signal line, and the second electrode of the first transistor is electrically connected to the first electrode of the second transistor and the gate electrode of the third transistor;
the gate electrode of the second transistor is electrically connected to the second gate signal line, and the second electrode of the second transistor is electrically connected to the first power source line;
the first electrode of the third transistor is electrically connected to the first power source line, and the second electrode of the third transistor is electrically connected to the first electrode of the light emitting element and the first electrode of the fourth transistor;
the gate electrode of the fourth transistor is electrically connected to the second gate signal line, and the second electrode of the fourth transistor is electrically connected to the second electric power source line; and
the second electrode of the light emitting element is electrically connected to the third electric power source line.

A light emitting device according to the present invention includes a plurality of pixels, each pixel of the plurality of pixels including:
a source signal line;
a first gate signal line;
a second gate signal line;
a third gate signal line;

a first electric power source line;
a second electric power source line;
a third electric power source line;
a first transistor having a gate electrode, a first electrode, and a second electrode;
a second transistor having a gate electrode, a first electrode, and a second electrode;
a third transistor having a gate electrode, a first electrode, and a second electrode;
a fourth transistor having a gate electrode, a first electrode, and a second electrode; and
a light emitting element having a first electrode and a second electrode,
in which:
the gate electrode of the first transistor is electrically connected to the first gate signal line, the first electrode of the first transistor is electrically connected to the source signal line, and the second electrode of the first transistor is electrically connected to the gate electrode of the second transistor;
the first electrode of the second transistor is electrically connected to the first electric power source line, and the second electrode of the second transistor is electrically connected to the first electrode of the third transistor;
the gate electrode of the third transistor is electrically connected to the second gate signal line, and the second electrode of the third transistor is electrically connected to the first electrode of the fourth transistor and the first electrode of the light emitting element;
the gate electrode of the fourth transistor is electrically connected to the third gate signal line, and the second electrode of the fourth transistor is electrically connected to the second electric power source line; and
the second electrode of the light emitting element is electrically connected to the third electric power source line.

A light emitting device according to the present invention includes a plurality of pixels, each pixel of the plurality of pixels including:
a source signal line;
a first gate signal line;
a second gate signal line;
a first electric power source line;
a second electric power source line;
a third electric power source line;
a first transistor having a gate electrode, a first electrode, and a second electrode;
a second transistor having a gate electrode, a first electrode, and a second electrode;
a third transistor having a gate electrode, a first electrode, and a second electrode;
a fourth transistor having a gate electrode, a first electrode, and a second electrode; and
a light emitting element having a first electrode and a second electrode,
in which:
the gate electrode of the first transistor is electrically connected to the first gate signal line, the first electrode of the first transistor is electrically connected to the source signal line, and the second electrode of the first transistor is electrically connected to the gate electrode of the second transistor;
the first electrode of the second transistor is electrically connected to the first electric power source line, and the second electrode of the second transistor is electrically connected to the first electrode of the third transistor;
the gate electrode of the third transistor is electrically connected to the second gate signal line, and the second electrode of the third transistor is electrically connected to the first electrode of the fourth transistor and the first electrode of the light emitting element;
the gate electrode of the fourth transistor is electrically connected to the second gate signal line, and the second electrode of the fourth transistor is electrically connected to the second electric power source line; and
the second electrode of the light emitting element is electrically connected to the third electric power source line.

A method of driving a light emitting device according to the present invention which has a plurality of pixels each being provided with a light emitting element, in which the light emitting device performs gray scale display by controlling differences in the amount of light emission time in the light emitting elements, includes:
one frame period having n subframe periods (where n is a natural number, n>2),
each of the subframe periods having:
an address (write-in) period for performing write-in of an image signal to the pixels; and
a sustain (light emitting) period for performing display by controlling light emission and no emission of the light emitting elements based on the image signal written into the pixels;
m subframe periods (where m is a natural number, and 0<m≦(n−1)) selected from the n subframe periods, each further having:
m reset periods for performing write-in of a reset signal to the pixels after the sustain (light emitting) period is complete, wherein the m reset periods do not mutually overlap with each other; and
m erasure periods which forcibly place the light emitting elements in a non-light emitting state when performing write-in of the reset signal; and
k subframe periods (where k is a natural number, and 0<k≦m) selected from the m subframe periods, each further having:
k reverse bias periods for applying a reverse bias voltage, the reverse bias voltage-having a polarity which is reversed with respect to a forward bias applied between the first electrode and the second electrode of the light emitting element when the light emitting element emits light, and wherein the k reverse bias periods do not mutually overlap with each other; and
k reverse bias application periods during which the reverse bias voltage applied in the reverse bias periods continues to be applied between the first electrode and the second electrode of the light emitting elements,
in which:
there is a period during which a portion of the address (write-in) period, a portion of the sustain (light emitting) period, the reset period, the erasure period, the reverse bias period, and the reverse bias application period mutually overlap; and
in a certain specific subframe period, the reverse bias application period is prepared within the erasure period.

In the above-mentioned method of driving a light emitting device according to the present invention, $|V_1|\geq|V_2|$ is satisfied, where $V_1$ is the forward bias voltage and $V_2$ is the reverse bias voltage.

BRIEF DESCRIPTION OF THE DRAWINGS

In the accompanying drawings.

FIGS. 11A to 11C are diagrams showing normal SES drive timing charts;

DETAILED DESCRIPTION OF THE PREFERRED EMBODIMENTS

Embodiment Mode 1

FIGS. 1A to 1E show an embodiment mode of a pixel structure for performing alternating current drive by the present invention.

Figure 1A:
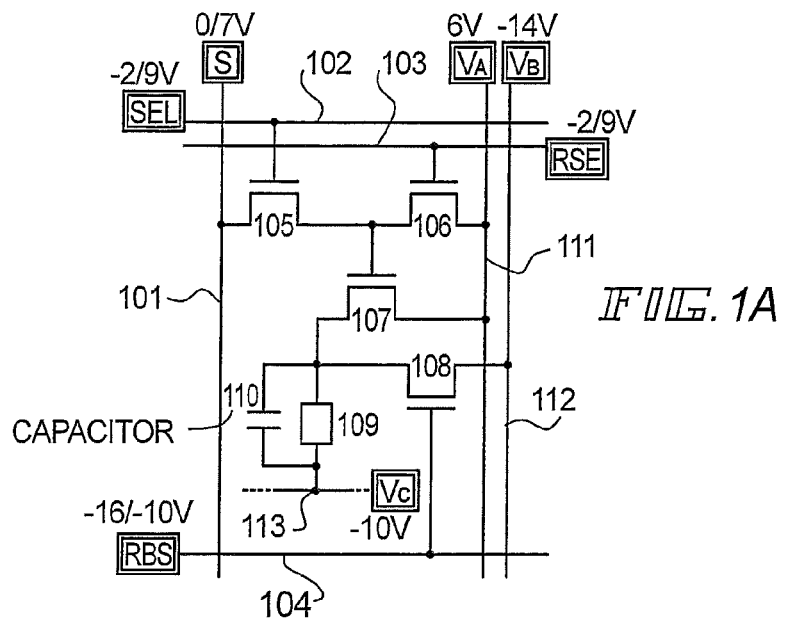
FIGS. 1A to 1E are diagrams showing an embodiment mode of the present invention.

As shown in FIG. 1A, each pixel has a source signal line (S) 101, a write-in gate signal line (SEL) 102, an erasure gate signal line (RSE) 103, a reverse bias gate signal line (RBS) 104, a switching TFT 105 as a third means, an erasure TFT 106 as a fifth means, a driver TFT 107 as a fourth means, a reverse bias TFT 108 as a sixth means, an EL element 109, an electric current supply line ($V_A$) 111, and a reverse bias electric power source line ($V_B$) 112. One electrode of the EL element 109 (pixel electrode) is connected to a source region or a drain region of the driver TFT 107, and the other electrode of the EL element 109 (opposing electrode) is connected to an opposing electric power source line ($V_C$) 113.

Electric potentials on each signal line and electric power source line within FIG. 1A are shown as electric power source potentials, or by signal L level and H level electric potentials. For example, the source signal line 101 has 0 V when L level, and 7 V when H level. Further, the electric potential of the electric current supply line 111 is 6 V, and the electric potential of the reverse bias electric power source line 112 is −14 V. Note that the electric potentials used here are examples, and that it is possible to operate the circuit of FIG. 1A without necessarily using these electric potentials. The on and off timing for the TFTs of each portion may suitably be determined in consideration of gate-source voltages and the like.

Operation of a case in which the switching TFT 105, the erasure TFT 106, and the reverse bias TFT 108 are all n-channel TFTs, the driver TFT 107 is a p-channel TFT, the side of the EL element 109 which is connected to the electric power source line 111 is an anode, and the side of the EL element 109 which is connected to the opposing electric power source line 113 is a cathode, is explained next.

Figure 1B:
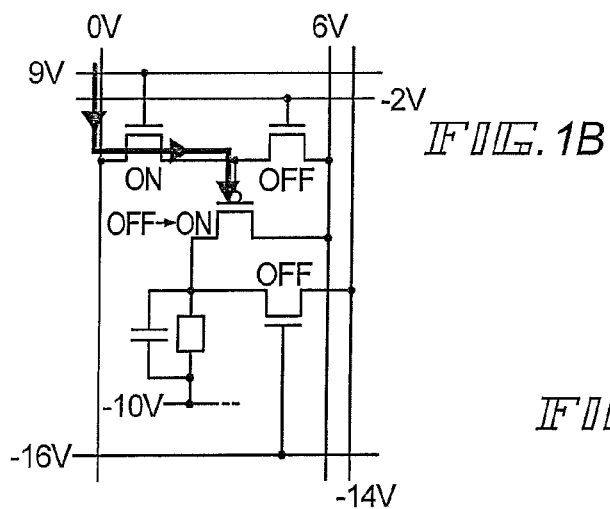

First, a pulse is input to the write-in gate signal line 102 during an address (write-in) period as shown in FIG. 1B. The write-in gate signal line 102 becomes H level (9 V), the switching TFT 105 turns on, and an image signal output to the source signal line 101 is input to a gate electrode of the driver TFT 107. The driver TFT 107 is a p-channel TFT here, and therefore turns off if the image signal is H level (7 V), and turns on if the image signal is L level (0 V).

Figure 1C:
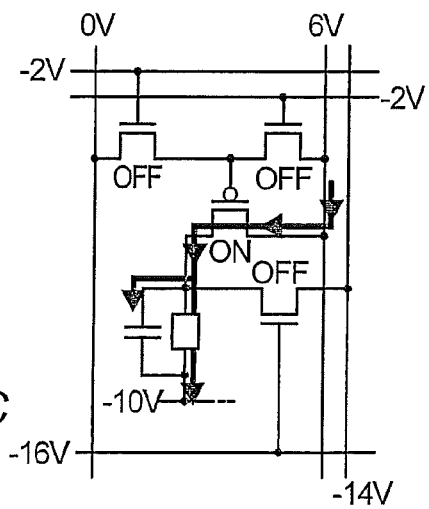

The electric potential of the electric current supply line 111 (6 V) is then input to the pixel electrode in a sustain (light emitting) period due to the driver TFT 107 turning on, as shown in FIG. 1C. A forward bias is applied to the EL element 109 due to the electric potential difference with the electric potential of the opposing electric power source line 113 (−10 V), and electric current flows in the EL element 109; which emits light. Further, electric current does not flow in the EL element 109 when the driver TFT 107 is off, and there is no light emission.

Figure 1D:
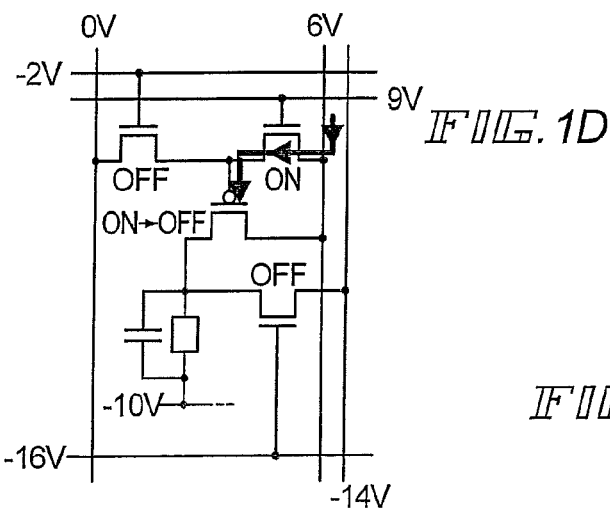

A pulse is then input to the erasure gate signal line 103, which becomes H level (9 V), in a reset period as shown in FIG. 1D, and the erasure TFT 106 turns on. The electric potential of the electric current supply line 111 (6 V) is input to the gate electrode of the driver TFT 107 due to the erasure transistor 106 being on, and therefore the voltage between the gate and the source of the driver TFT 107 becomes zero, and the driver TFT 107 turns off. The EL element 109 consequently does not emit light.

Figure 1E:
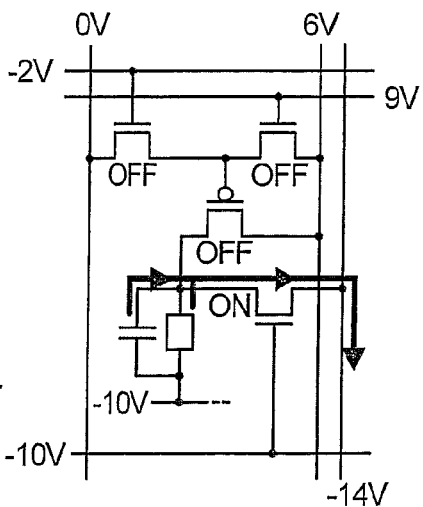

On the other hand, a pulse is input to the reverse bias gate signal line 104, which becomes H level (−10 V), in a reverse bias period as shown in FIG. 1E, and the reverse bias TFT 108 turns on. The electric potential of the reverse bias electric power source line 112 (−14 V) is input to the pixel electrode due to the reverse bias TFT 108 turning on. The electric potential of the reverse bias electric power source line 112 (−14 V) is set lower than the electric potential of the opposing electrode electric power source line 113 (−10 V) here, and therefore a reverse bias is applied to the EL element 109. The reverse bias continues to be applied to the EL element 109 while an H level electric potential (−10 V) is input to the reverse bias gate signal line 104.

Further, even if pulse input to the reverse bias gate signal line 104 ends, and the reverse bias TFT 108 turns off, electric charge on the pixel electrode is maintained by the EL element 109 itself, that is by a parasitic capacitance between the anode and the cathode of the EL element 109, or by a capacitance formed between the pixel electrode and a fixed electric potential, and the reverse bias continues to be applied to the EL element 109.

Note that the erasure gate signal line and the reverse bias gate signal line are formed separately in the structure shown in FIGS. 1A to 1E, and therefore the length of the reverse bias period with respect to an erasure period can be arbitrarily set. Further, alternating current drive becomes possible, without lowering the duty ratio, by preparing the reverse bias period and the erasure period of each line at the same timing.

Embodiment Mode 2

FIGS. 2A to 2D show an embodiment mode, which differs from embodiment mode 1, of a pixel structure for performing alternating current drive by the present invention.

Figure 2A:
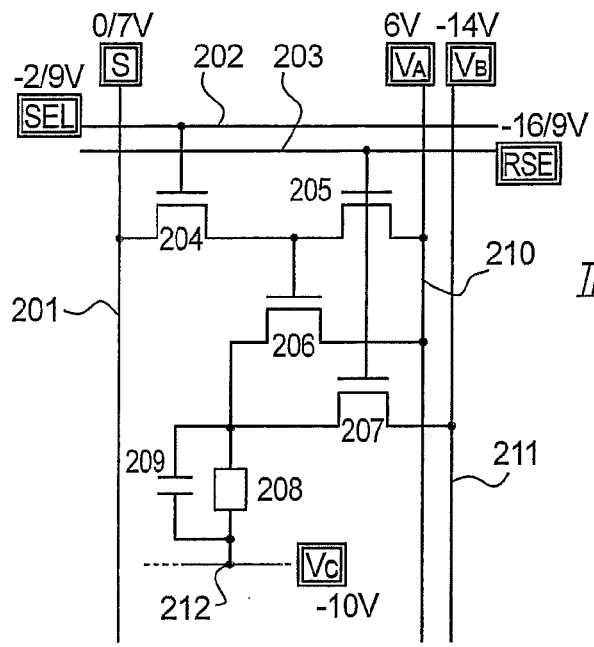
FIGS. 2A to 2D are diagrams showing another embodiment mode of the present invention.

As shown in FIG. 2A, each pixel has a source signal line (S) 201, a write-in gate signal line (SEL) 202, an erasure and reverse bias gate signal line (RSE) 203, a switching TFT 204, an erasure TFT 205, a driver TFT 206, a reverse bias TFT 207, an EL element 208, an electric current supply line (V$_A$) 210, and a reverse bias electric power source line 211 (V$_B$). One electrode of the EL element 208 (pixel electrode) is connected to a source region or a drain region of the driver TFT 206, and the other electrode of the EL element 208 (opposing electrode) is connected to an opposing electric power source line (V$_C$) 212.

Electric potentials on each signal line and electric power source line within FIG. 2A are shown as electric power source potentials, or by signal L level and H level electric potentials. For example, the source signal line 201 has 0 V when L level, and 7 V when H level. Further, the electric potential of the electric current supply line 210 is 6 V, and the electric potential of the reverse bias electric power source line 211 is −14 V. Note that the electric potentials used here are examples, and that it is possible to operate the circuit of FIG. 2A without necessarily using these electric potentials. The on and off timing for the TFTs of each portion may suitably be determined in consideration of gate-source voltages and the like.

Operation of a case in which the switching TFT 204, the erasure TFT 205, and the reverse bias TFT 207 are all n-channel TFTs, the driver TFT 206 is a p-channel TFT, the side of the EL element 208 which is connected to the electric power source line 210 is an anode, and the side of the EL element 209 which is connected to the opposing electric power source line 212 is a cathode, is explained here.

Figure 2B:
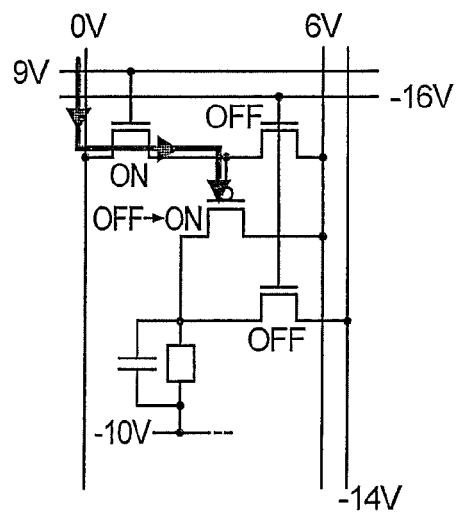

First, a pulse is input to the write-in gate signal line 202 during an address (write-in) period as shown in FIG. 2B. The write-in gate signal line 202 becomes H level (9 V), the switching TFT 204 turns on, and an image signal output to the source signal line 201 is input to a gate electrode of the driver TFT 206. The driver TFT 206 is a p-channel TFT here, and therefore turns off if the image signal is H level (7 V), and turns on if the image signal is L level (0 V).

Figure 2C:
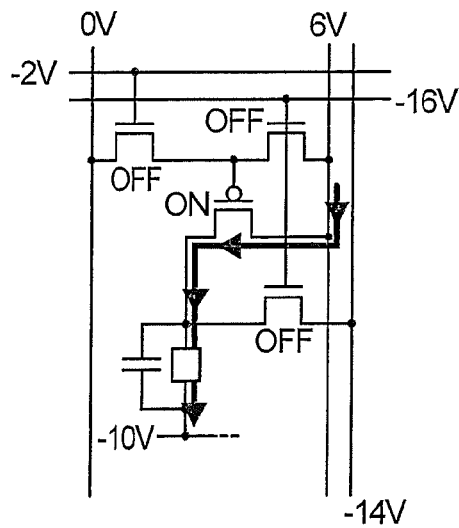

The electric potential of the electric current supply line 210 (6 V) is then input to the pixel electrode in a sustain (light emitting) period due to the driver TFT 206 turning on, as shown in FIG. 2C. A forward bias is applied to the EL element 208 due to the electric potential difference with the electric potential of the opposing electric power source line 212 (−10 V), and electric current flows in the EL element 208, which emits light. Further, electric current does not flow in the EL element 208 when the driver TFT 206 is off, and there is no light emission.

Figure 2D:
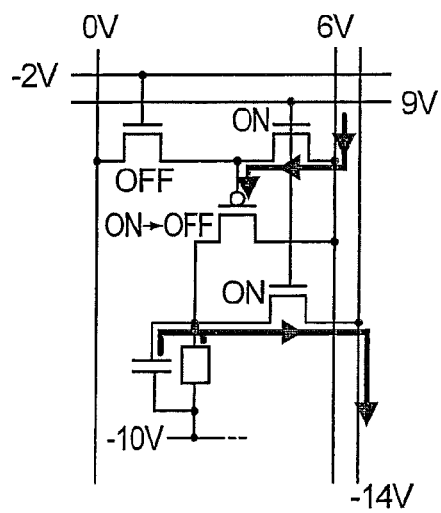

A pulse is then input to the erasure and reverse bias gate signal line 203, which becomes H level (9 V), in a reset and reverse bias period as shown in FIG. 2D, and the erasure TFT 205 and the reverse bias TFT 207 turn on. The electric potential of the electric current supply line 210 (6 V) is input to the gate electrode of the driver TFT 206 due to the erasure transistor 205 being on, and therefore the electric potential difference between the gate and the source of the driver TFT 206 becomes zero, and the driver TFT 206 turns off.

At the same time, the electric potential of the reverse bias electric power source line 211 (−14 V) is input to the pixel electrode due to the reverse bias TFT 207 turning on. The electric potential of the reverse bias electric power source line 211 (−14 V) is set lower than the electric potential of the opposing electrode electric power source line 212 (−10 V) here, and therefore a reverse bias is applied to the EL element 208. The reverse bias continues to be applied to the EL element 208 while an H level electric potential (−10 V) is input to the erasure and reverse bias gate signal line 203.

Further, even if pulse input to the erasure and reverse bias gate signal line 203 ends, and the reverse bias TFT 207 turns off, electric charge on the pixel electrode is maintained by a capacitor 209 of the EL element 208 itself, or by a capacitor formed between the pixel electrode and a certain fixed electric potential, and the reverse bias continues to be applied to the EL element 208.

An erasure period and the reverse bias period of each line become in the same period here, and a high duty ratio can be achieved. Further, the erasure and reverse bias period periods may be extended, and the length may be set arbitrarily.

Embodiment Mode 3

FIGS. 3A to 3E show an embodiment mode, which differs from embodiment modes 1 and 2, of a pixel structure for performing alternating current drive by the present invention.

Figure 3A:
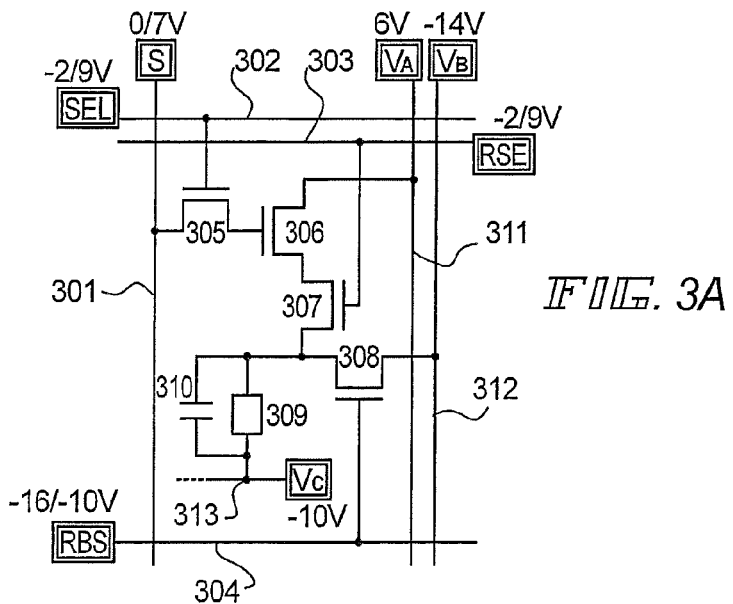
FIGS. 3A to 3E are diagrams showing another embodiment mode of the present invention.

As shown in FIG. 3A, each pixel has a source signal line (S) 301, a write-in gate signal line (SEL) 302, an erasure gate signal line (RSE) 303, a reverse bias gate signal line (RBS) 304, a switching TFT 305, a driver TFT 306, an erasure TFT 307, a reverse bias TFT 308, an EL element 309, an electric current supply line (V$_A$) 311, and a reverse bias electric power source line (V$_B$) 312. One electrode of the EL element 309 (pixel electrode) is connected to a source region or a drain region of the driver TFT 306 through the erasure TFT 307, and the other electrode of the EL element 309 (opposing electrode) is connected to an opposing electric power source line (V$_C$) 313.

Electric potentials on each signal line and electric power source line within FIG. 3A are shown as electric power source potentials, or by signal L level and H level electric potentials. For example, the source signal line 301 has 0 V when L level, and 7 V when H level. Further, the electric potential of the electric current supply line 311 is 6 V, and the electric potential of the reverse bias electric power source line 312 is −14 V. Note that the electric potentials used here are examples, and that it is possible to operate the circuit of FIG. 3A without necessarily using these electric potentials. The on and off timing for the TFTs of each portion may suitably be determined in consideration of gate-source voltages and the like.

Operation of a case in which the switching TFT 305 and the reverse bias TFT 308 are n-channel TFTs, the driver TFT 306 and the erasure TFT 307 are p-channel TFTs, the side of the EL element 309 which is connected to the electric power source line 311 is an anode, and the side of the EL element 309 which is connected to the opposing electric power source line 313 is a cathode, is explained here.

Figure 3B:
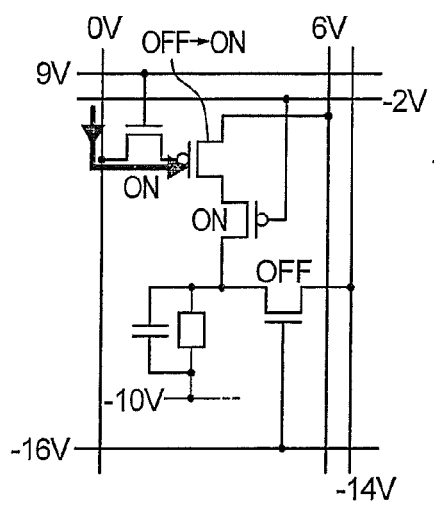

First, a pulse is input to the write-in gate signal line 302 during an address (write-in) period as shown in FIG. 3B. The write-in gate signal line 302 becomes H level (9 V), the switching TFT 305 turns on, and an image signal output to the source signal line 301 is input to a gate electrode of the driver TFT 306. The driver TFT 306 is a p-channel TFT here, and therefore turns off if the image signal is H level (7 V), and turns on if the image signal is L level (0 V).

Further, an L level electric potential (−2 V) is input to the erasure gate signal line 303, and the erasure TFT 307 turns on.

Figure 3C:
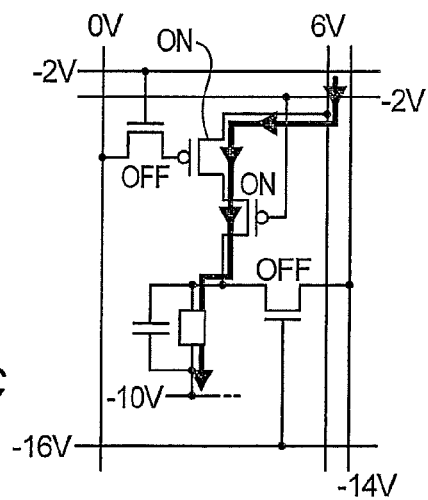

An L level electric potential (−2 V) is always input to the erasure gate signal line 303 in a sustain (light emitting) period, as shown in FIG. 3C, and the erasure TFT 307 continues to be on. In addition, the electric potential of the electric current supply line 311 (−6 V) is input to the pixel electrode due to the driver TFT 306 turning on. A forward bias is applied to the EL element 309 due to the electric potential difference with the electric potential of the opposing electric power source line 313 (−10 V), and electric current flows in the EL element 309, which emits light. Further, electric current does not flow in the EL element 309 when the driver TFT 306 is off, and there is no light emission.

Figure 3D:
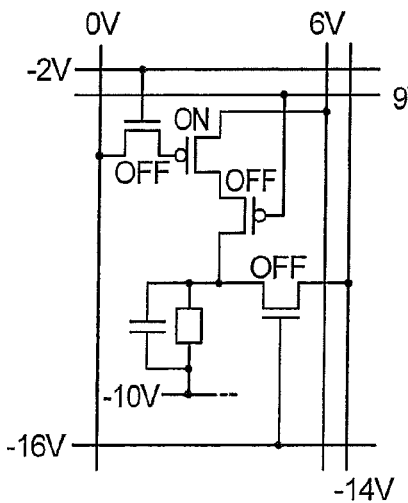

A pulse is then input to the erasure gate signal line 303, which becomes H level (−9 V), in a reset period as shown in FIG. 3D, and the erasure TFT 307 turns off. A current supply pathway from the electric current supply line 311 to the EL element 309 is cutoff by the erasure TFT 307 turning off, and the EL element 309 stops emitting light. Differing from embodiment modes 1 and 2, the erasure TFT 307 continues to be on throughout the light emitting period, and continues to be off throughout an erasure period.

Figure 3E:
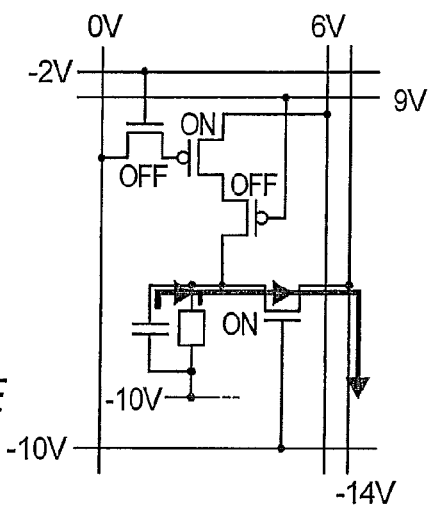

On the other hand, a pulse is input to the reverse bias gate signal line 304, which becomes H level (−10 V), in a reverse bias period as shown in FIG. 3E, and the reverse bias TFT 308 turns on. The electric potential of the reverse bias electric power source line 312 (−14 V) is input to the pixel electrode due to the reverse bias TFT 308 turning on. The electric potential of the reverse bias electric power source line 312 (−14V) is set lower than the electric potential of the opposing electrode electric power source line 313 (−10 V) here, and therefore a reverse bias is applied to the EL element 309. The reverse bias continues to be applied to the EL element 309 while an H level electric potential (−10 V) is input to the reverse bias gate signal line 304.

Further, even if pulse input to the reverse bias gate signal line 304 ends, and the reverse bias TFT 308 turns off, electric charge on the pixel electrode is maintained by a capacitance 310 of the EL element 309 itself, or by a capacitance formed between the pixel electrode and a certain fixed electric potential, and the reverse bias continues to be applied to the EL element 309.

Note that it is necessary for the erasure TFT 307 to always be off throughout the erasure period. The reverse bias period and the erasure period of each line can therefore overlap, and a high duty ratio can be achieved. Further, reverse bias period can be set to an arbitrary length.

Embodiment Mode 4

FIGS. 4A to 4D show an embodiment mode, which differs from embodiment modes 1 to 3, of a pixel structure for performing alternating current drive by the present invention.

Figure 4A:
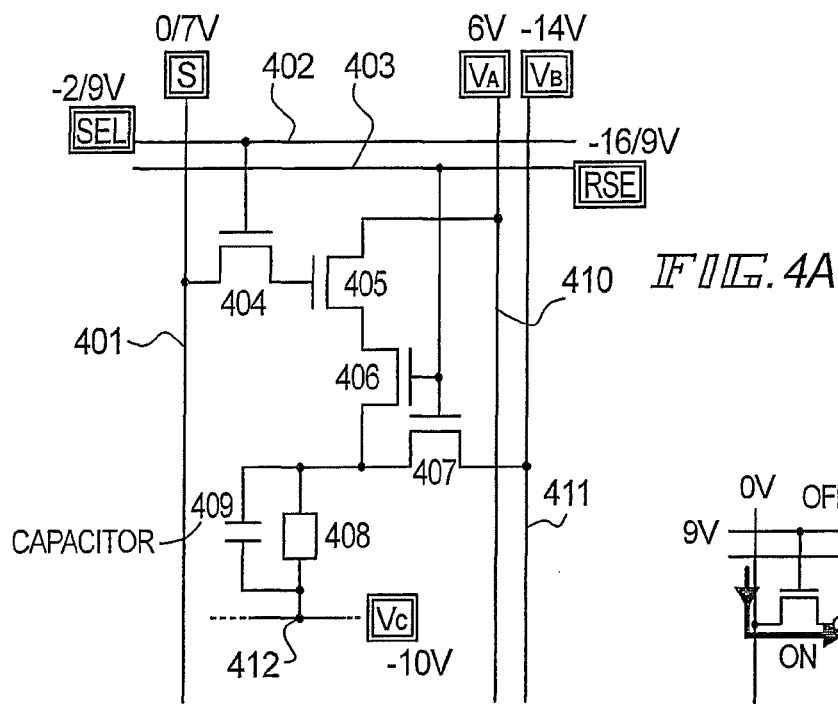
FIGS. 4A to 4D are diagrams showing another embodiment mode of the present invention.

As shown in FIG. 4A, each pixel has a source signal line (S) 401, a write-in gate signal line (SEL) 402, an erasure and reverse bias gate signal line (RSE) 403, a switching TFT 404, a driver TFT 405, an erasure TFT 406, a reverse bias TFT 407, an EL element 408, an electric current supply line ($V_A$) 410, and a reverse bias electric power source line 411 ($V_B$). One electrode of the EL element 408 (pixel electrode) is connected to a source region or a drain region of the driver TFT 405 through the erasure TFT 406, and the other electrode of the EL element 408 (opposing electrode) is connected to an opposing electric power source line ($V_C$) 412:

Electric potentials on each signal line and electric power source line within FIG. 4A are shown as electric power source potentials, or by signal L level and H level electric potentials. For example, the source signal line 401 has 0 V when L level, and 7 V when H level. Further, the electric potential of the electric current supply line 410 is 6 V, and the electric potential of the reverse bias electric power source line 411 is −14 V. Note that the electric potentials used here are examples, and that it is possible to operate the circuit of FIG. 4A without necessarily using these electric potentials. The on and off timing for the TFTs of each portion may suitably be determined in consideration of gate-source voltages and the like.

Operation of a case in which the switching TFT 404 and the reverse bias TFT 407 are n-channel TFTs, the driver TFT 405 and the erasure TFT 406 are p-channel TFTs, the electric current supply line 410 is set to an anode electric potential, and the opposing electric power source line 412 is set to a cathode electric potential, is explained here. In the EL element 408, the side which is connected to the electric power source line 410 is an anode, and the side which is connected to the opposing electric power source line 412 is a cathode.

Figure 4B:
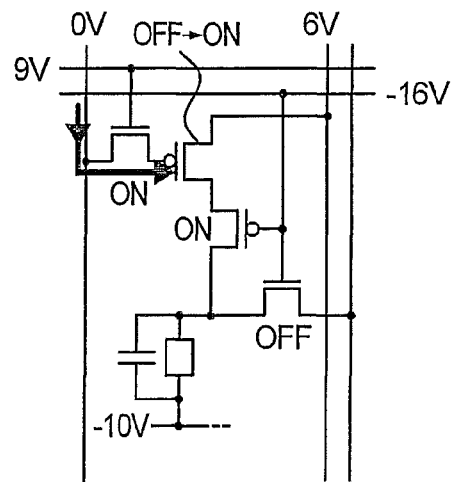

First, a pulse is input to the write-in gate signal line 402 during an address (write-in) period as shown in FIG. 4B. The write-in gate signal line 402 becomes H level (9 V), the switching TFT 404 turns on, and an image signal output to the source signal line 401 is input to a gate electrode of the driver TFT 405. The driver TFT 405 is a p-channel TFT here, and therefore turns off if the image signal is H level (7 V), and turns on if the image signal is L level (0 V).

Further, an L level electric potential (−16 V) is input to the erasure and reverse bias gate signal line 403, the erasure TFT 406 turns on, and the reverse bias TFT 407 turns off.

Figure 4C:
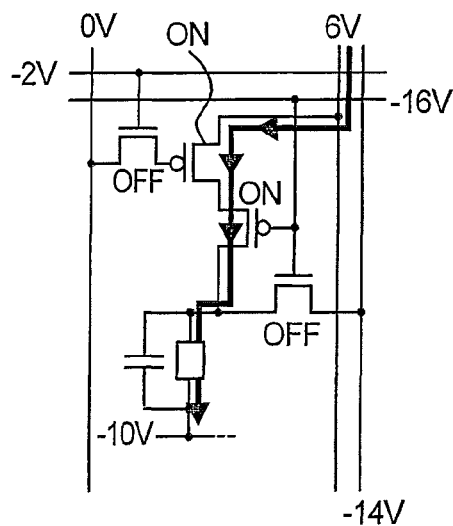

An L level electric potential (−16 V) is always input to the erasure and reverse bias gate signal line 403 in a sustain (light emitting) period, as shown in FIG. 4C, and the erasure TFT 406 continues to be on, while the reverse bias TFT 407 continues to be off.

In addition, the electric potential of the electric current supply line 410 (6 V) is input to the pixel electrode due to the driver TFT 405 turning on. A forward bias is applied to the EL element 408 due to the electric potential difference with the electric potential of the opposing electric power source line 412 (−10V), and electric current flows in the EL element 408, which emits light. Further, electric current does not flow in the EL element 408 when the driver TFT 405 is off, and there is no light emission.

Figure 4D:
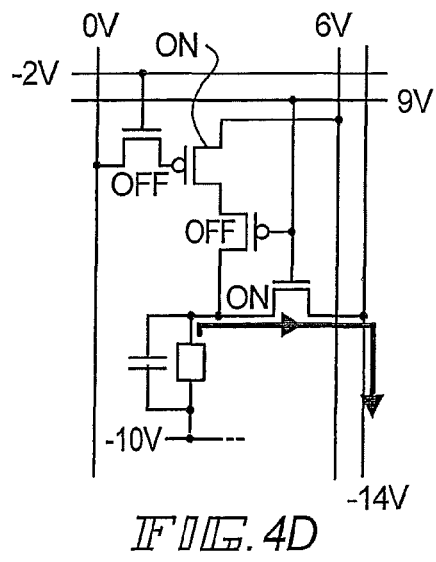

An H level electric potential (9 V) is always input to the erasure and reverse bias gate signal line 403 in a reset and reverse bias period, as shown in FIG. 4D, the erasure TFT 406 turns off, and the reverse bias TFT 407 turns on. The electric potential of the reverse bias electric power source line (−14 V) is thus input to the pixel electrode by this operation. The electric potential of the reverse bias electric power source line 411 (−14 V) is set lower than the electric potential of the opposing electrode electric power source line 412 (−10 V) here, and therefore a reverse bias is applied to the EL element 408. A period during which an H level electric potential (9 V) is input to the erasure and reverse bias gate signal line 403 is one in which a current supply pathway from the electric current supply line 410 to the EL element 408 is cutoff due to the erasure TFT 406 continuing to be in an off state, and the EL element 408 does not emit light. The reverse bias continues to be applied to the EL element 408 due to the reverse bias TFT 407 continuing to be turned on.

The erasure period of each line and the reverse bias period become in the same period here, and a high duty ratio can therefore be achieved. Furthermore, the erasure and reverse bias period can be extended and set to an arbitrary length.

Reverse biases having arbitrary values corresponding to R, G, and B color EL elements can thus be applied in a color display light emitting device by forming a reverse bias electric power source line in each pixel, as discussed in embodiment modes 1 to 4.

Further, the electric potential of the reverse bias electric power source line corresponding to the electric potential used for application of the highest reverse bias from among the R, G, and B colors may be shared, and the reverse bias electric power source line may also be shared among adjacent pixels. The number of wirings can be reduced in this case, and a high aperture ratio can be expected.

Furthermore, cases of operating driver TFTs in a linear region, namely examples of constant voltage driving methods, are explained in embodiment modes 1 to 4. It is preferable, however, to perform constant current drive, in which the driver TFTs are operated in a saturated region and a fixed electric current is supplied to the EL elements, for cases in which the EL element lifetime is taken into consideration.

EMBODIMENTS

Embodiments of the present invention are discussed below.

Embodiment 1

Figure 12:
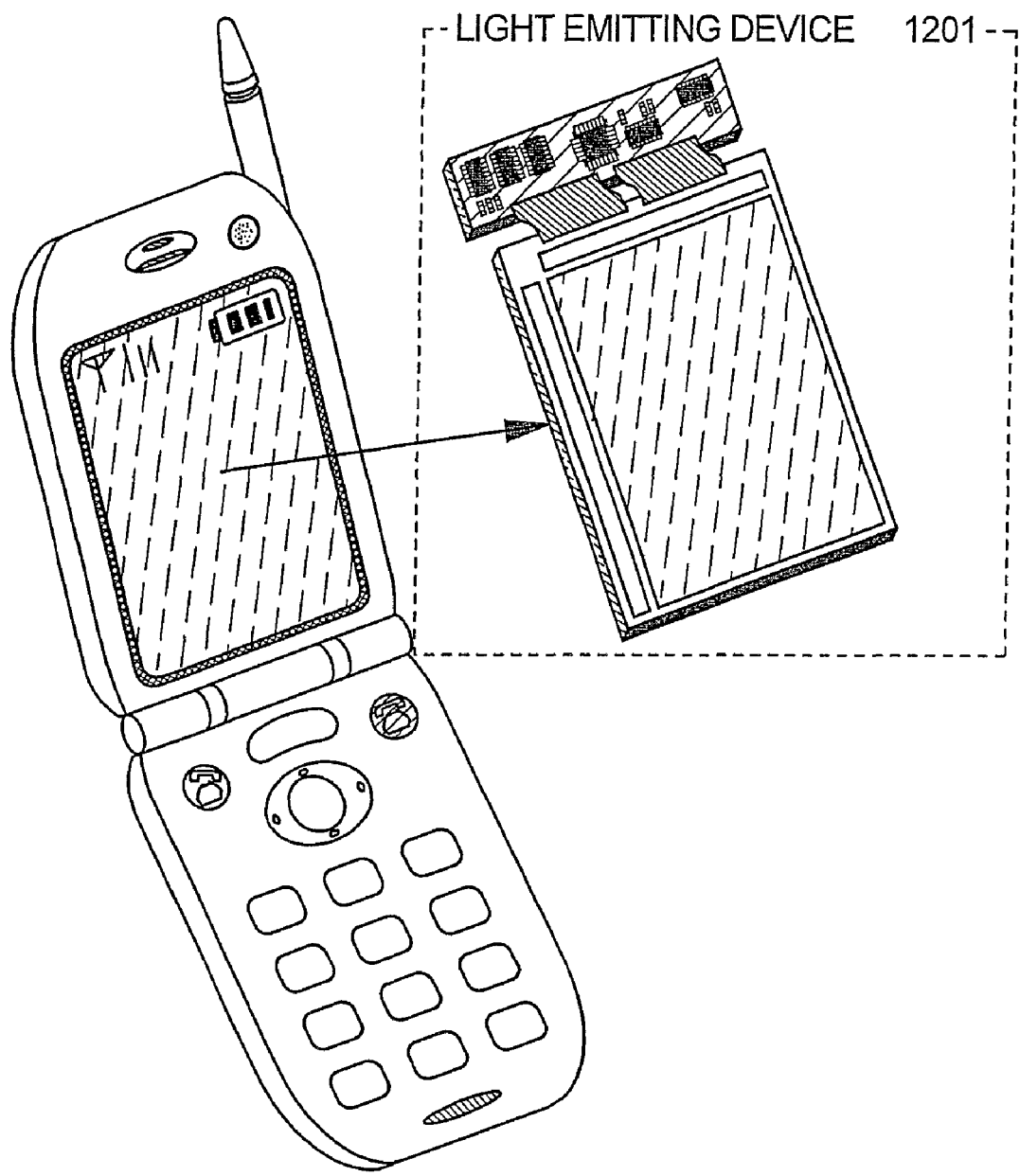
FIG. 12 is a diagram showing a light emitting device mounted in electronic equipment.

A light emitting device 1201 is built-in in a manner shown in FIG. 12 when using the light emitting device as a display portion of an electronic device, such as a portable telephone. The light emitting device 1201 indicates an embodiment in which a panel and a substrate are connected to each other, with a signal processing LSI, memory, and the like mounted on the substrate.

Figure 6A:
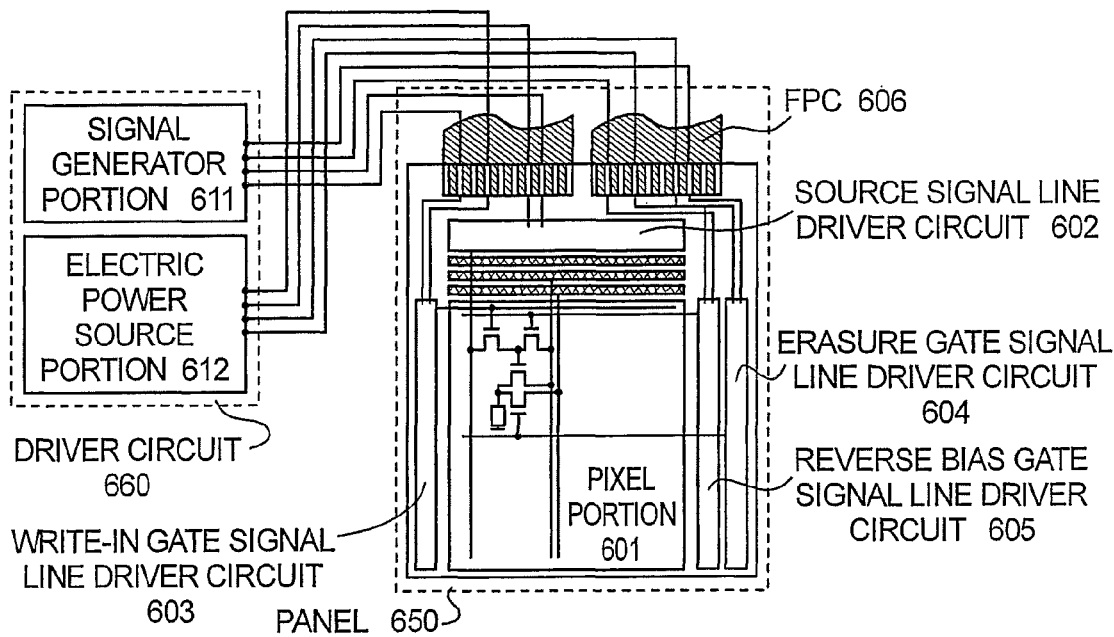
FIGS. 6A and 6B are block diagrams showing the structure of a light emitting device.

A block diagram of the light emitting device 1201 is shown in FIG. 6A. The light emitting device 1201 has a panel 650 and a driver circuit 660.

The driver circuit 660 has a signal generator portion 611 and an electric power source portion 612. The electric power source portion 612 generates a plurality of desired voltage value electric power sources from an electric power source supplied by an external battery. The plurality of desired voltage value electric power sources are supplied to a source signal line driver circuit, a gate signal line driver circuit, a light emitting element, the signal generator portion 611, and the like. An electric power source, an image signal, and a synchronous signal are input to the signal generator portion 611. In addition to performing conversion of the various types of signals so that they can be processed by the panel 650, the signal generator portion 611 also generates a clock signal and the like in order to drive the source signal line driver circuit and the gate signal line driver circuit.

Further, the panel 650 is structured by disposing a pixel portion 601, a source signal line driver circuit 602, a write-in gate signal line driver circuit 603, an erasure gate signal line driver circuit 604, a reverse bias gate signal line driver circuit 605, and FPC 606, and the like on the substrate.

The pixel portion 601 is disposed in a substrate central portion, and the source signal line driver circuit 602, the write-in gate signal line driver circuit 603, the erasure gate signal line driver circuit 604, the reverse bias gate signal line driver circuit 605, and the like are arranged in a periphery portion. An opposing electrode of the EL element is formed on the entire surface of the pixel portion 601, and an opposing electric potential is imparted through the FPC 606. Supply of signals and electric power sources for driving the source signal line driver circuit 602, the write-in gate signal line driver circuit 603, the erasure gate signal line driver circuit 604, and the reverse bias gate signal line driver circuit 605, is performed by the driver circuit 660, through the FPC 606.

Figure 6B:
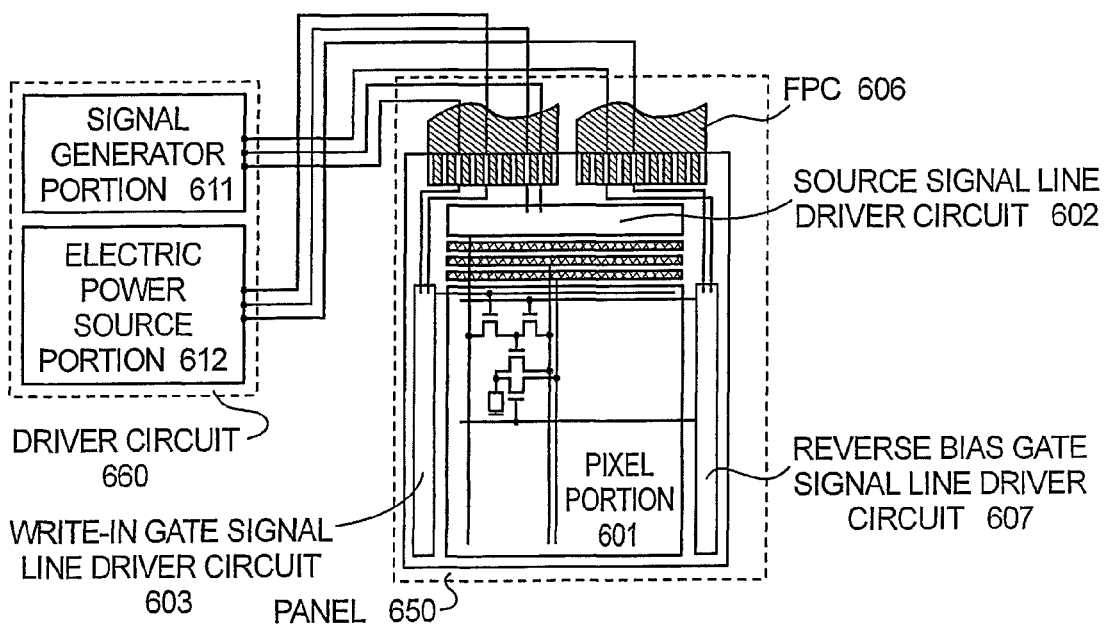

Further, as shown in FIG. 6B, an erasure and reverse bias gate signal line driver circuit 607 can be used, instead of using both the erasure gate signal line driver circuit 604 and the reverse bias gate signal line driver circuit 605, for cases in which an erasure period and a reverse bias period are prepared at the same timing, and a narrower frame formation becomes possible.

The light emitting device 1201 disclosed in embodiment 1 is one in which the panel 650 and the driver circuit 660, which contains the signal generator portion 611 and the electric power source portion 612, are made separately, the panel 650 and the driver circuit 660 may also be manufactured as integrated on the substrate.

Embodiment 2

Figure 7:
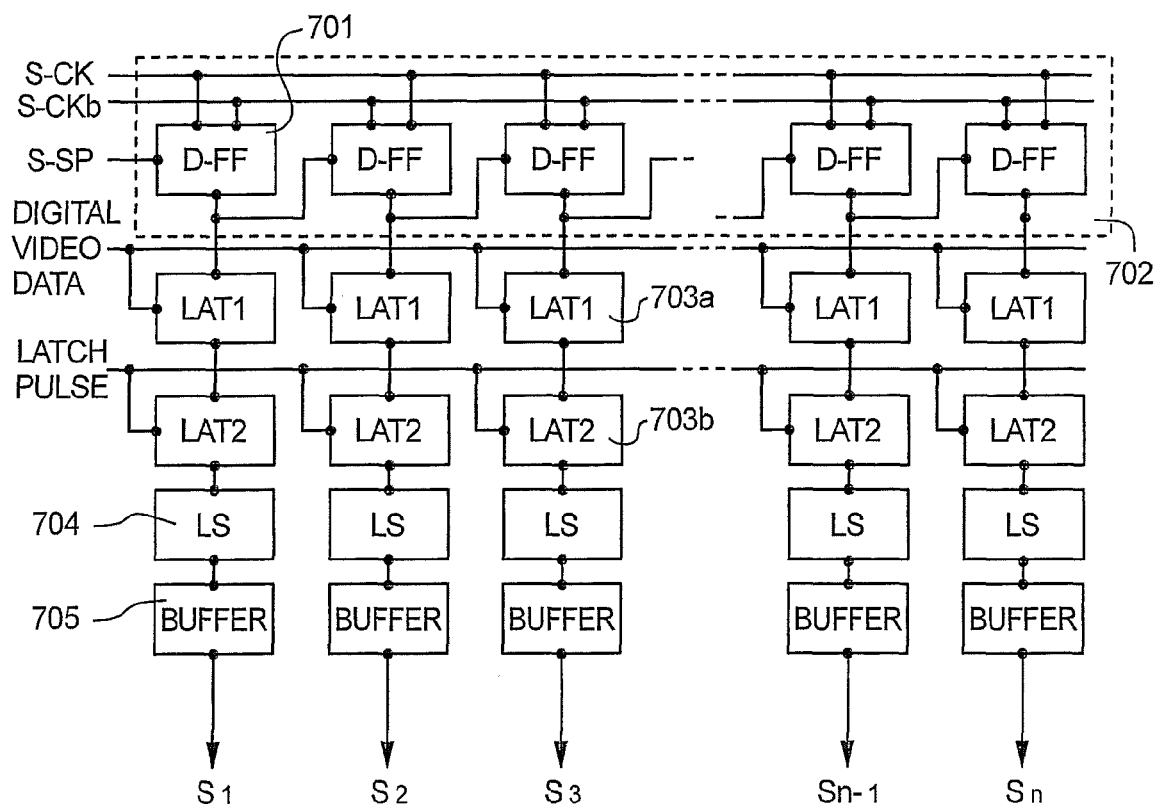
FIG. 7 is a diagram showing an example of the structure of a source signal line driver circuit.
Figure 8:
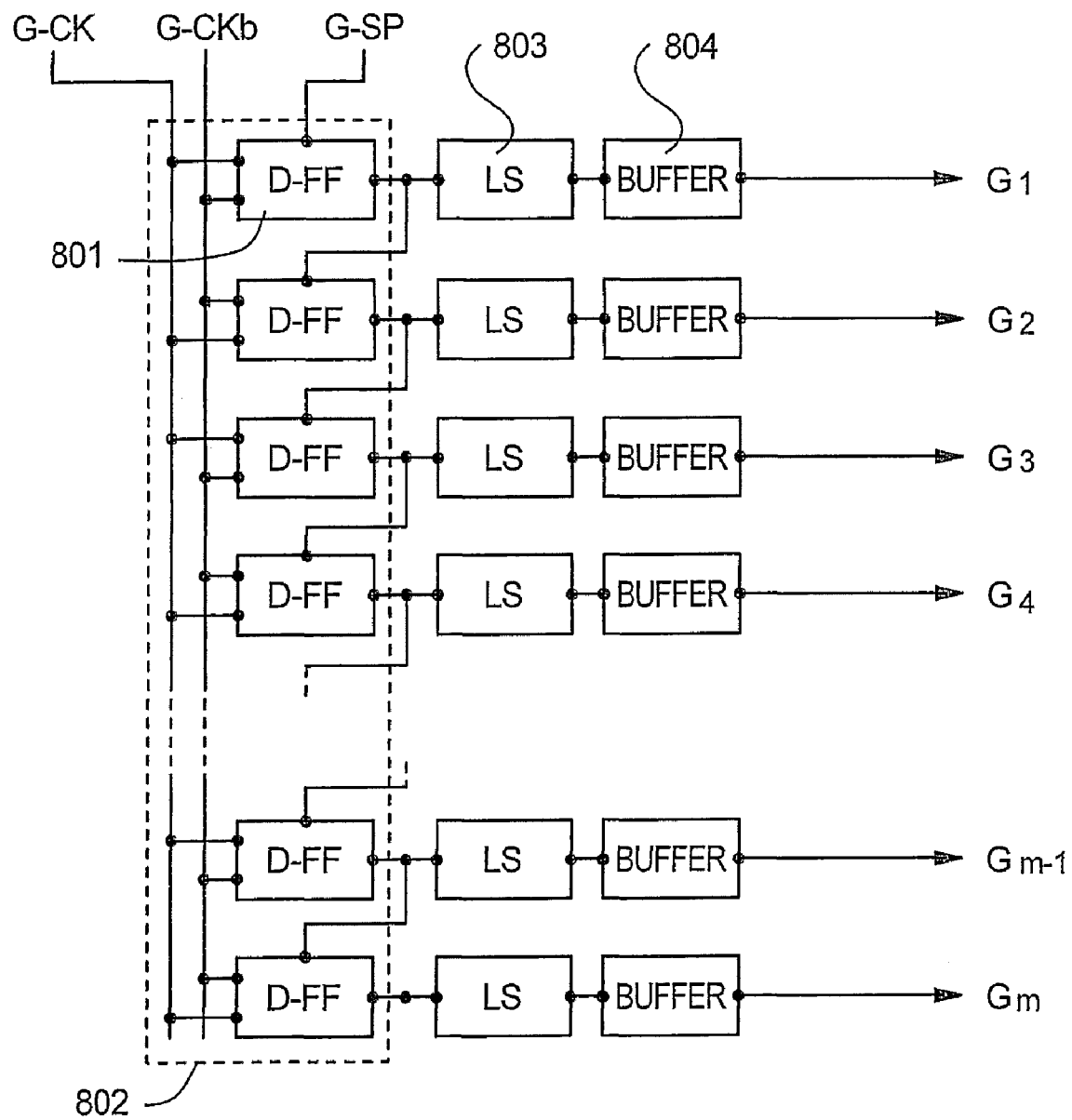
FIG. 8 is a diagram showing an example of the structure of a gate signal line driver circuit.

A schematic diagram of a source signal line driver circuit is shown in FIG. 7, and a schematic diagram of a gate signal line driver circuit is shown in FIG. 8, for a case of performing image display by using a digital image signal.

The source signal line driver circuit has a shift register 702 that uses a plurality of states of D flip-flops 701, first latch circuits 703a, second latch circuits 703b, level shifters 704, buffers 705, and the like. Signals input from an outside portion are a clock signal (S-CK), an inverted clock signal (S-CKb), a start pulse (S-SP), and a digital image signal (digital video signal). The digital image signal is input directly with the structure like that of FIG. 7. For example, input takes place from the first row, to the second row, ..., to the last row of the most significant bit, then from the first row, to the second row, ..., to the last row of the second bit, and continuing on until the first row, to the second row, ..., to the last row of the least significant bit.

First, sampling pulses are output one after another from the shift register 702 in accordance with the timing of the clock signal, the inverted clock signal, and the start pulse. The sampling pulses are then input to the first latch circuits 703a, and the digital image signal is read in and stored bit by bit at the timing whereat the sampling pulse is input. This operation is performed in order from a first column.

A latch pulse is input during a horizontal return period when storage of the digital image signal in the final stage first latch circuit 703a is complete. The digital signals stored in the first latch circuits 703a are then sent all at once to the second latch circuits 703b at this timing. Pulse amplitude conversion is then performed by the level shifters 704, and after the image signal waveforms are reshaped in the buffers, they are output to the respective source signal lines S1 to Sn.

On the other hand, the gate signal line driver circuit has a shift register 802 that uses a plurality of stages of D flip-flops 801, level shifters 803, buffers 804, and the like. Signals input from an outside portion are a clock signal (G-CK), an inverted clock signal (G-CKb), and a start pulse (G-SP)

First, pulses are output one after another by the shift register 802 in accordance with the timing of the clock signal, the inverted clock signal, and the start pulse. Pulse width conversion is then performed by the level shifters 803, and after the pulse waveforms are reshaped in the buffers, they are output to the respective gate signal lines G1 to Gm as a pulse for selecting the gate signal lines in order. After selection of the last row gate signal line Gm is complete, and after a vertical return period, pulses are once again output from the shift register 802, and selection of the gate signal lines in order is performed.

Figure 9:
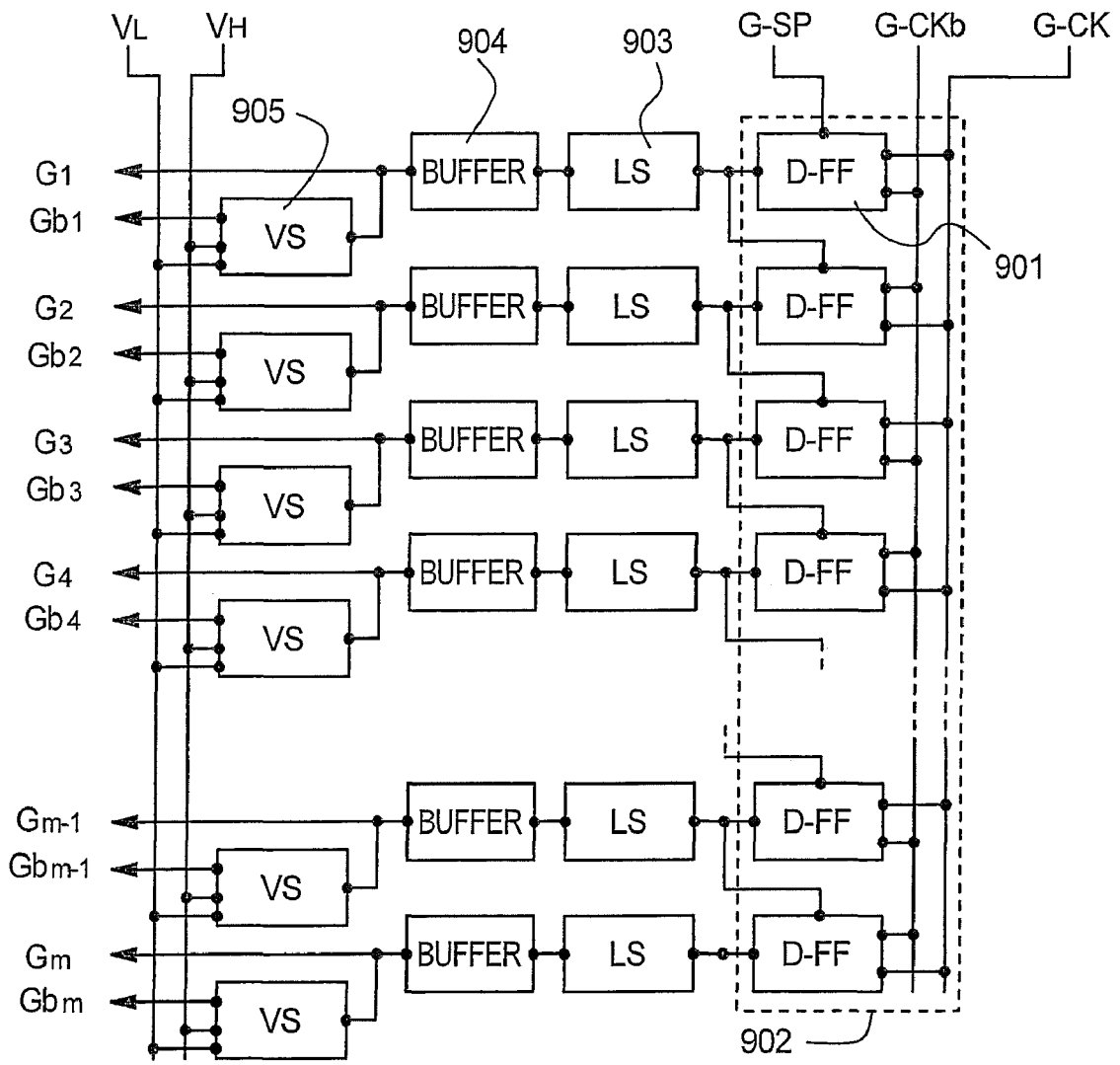
FIG. 9 is a diagram showing an example of the structure of a gate signal line driver circuit using for both erasure and for reverse biasing.

Further, an erasure gate signal line driver circuit and a reverse bias gate signal line driver circuit can be made into the same circuit by a method like that shown in FIG. 9 by employing embodiment modes 1 and 3 for cases in which pulses are input at the exact same timing to erasure gate signal lines and reverse bias gate signal lines. It is thus possible to made the frame smaller.

The gate signal line driver circuit of FIG. 9 has a shift register 902 that uses a plurality of stages of D flip-flops 901, level shifters 903, buffers 904, voltage converter circuits 905, and the like. Signals input from an outside portion are a clock signal (G-CK), an inverted clock signal (G-CKb), and a start pulse (G-SP).

Operation is nearly the same as that of the gate signal line driver circuit discussed above. Pulses output one after another from the shift register 902 undergo amplitude conversion by the level shifters 903. Further, after pulse waveform reshaping is performed by the buffers 904, the pulses are separated into those output as is to erasure gate signal lines G1 to Gm, and those input to the voltage converter circuits 905. The latter pulses are converted into pulses having a desired amplitude (from $V_L$ to $V_H$) by the voltage converter circuits 905, and output to reverse bias gate signal lines Gb1 to Gbm. Further, the voltage converter circuits 905 may also be formed on the erasure gate signal lines G1 to Gm side.

Embodiment 3

Actual operation timing for a case of driving a pixel structure by SES driver, as given in the embodiment modes, and applying a reverse bias is explained by using FIGS. 10A to 10C, and FIGS. 11A to 11C.

Normal SES drive is explained first using FIGS. 11A to 11C.

One frame period is divided into a plurality of subframe periods. One frame period is divided into six subframe periods SF1 to SF6 here as an example. Each of the subframe periods has an address (write-in) period Ta and a sustain (light emitting) period Ts. Each of the sustain (light emitting) periods of the subframe periods has a different length. The amount of time that each pixel emits light in one frame period is determined by selecting the subframes during which each EL element emits light. Gray scale is thus performed in accordance with the relative lengths of time during which light is emitted.

As the number of subframe divisions is increased, it becomes possible to perform multi-gray scale display. However, the sustain (light emitting) period becomes shorter than the address (write-in) period in a portion of the subframe periods. The address (write-in) periods of different subframe periods cannot overlap in this case, and therefore a reset period Tr and an erasure period Te are also used.

The reset period Tr is a period during which a signal for forcibly placing the EL element into a non-light emitting state is input to the pixel. The erasure period Te is a period during which the non-light emitting state of the EL element continues based on the signal input in the reset period.

For the operation, pulses are input in order from a first write-in gate signal line during an address (write-in) period Ta1 of the subframe period SF1, and a digital image signal output to a source signal line is written in. Operation immediately shifts to a sustain (light emitting) period Ts1 for rows into which the digital image signal has been written. The address (write-in) period Ta1 is complete when write-in operation from a first row to a last row are complete. Pulses are next input to the write-in gate signal lines from the first row, in which the sustain (light emitting) period Ta1 is complete, and an address (write-in) period Ta2 of the subframe period SF2 begins.

The subframe periods SF2 and SF3 are completed by repeating the aforementioned operations, and an address (write-in) period ta4 of the subframe period SF4 begins. An address (write-in) period Ta4 is longer than a sustain (light emitting) period Ts4 here, and therefore a next address (write-in) period Ta5 cannot begin immediately after the sustain (light emitting) period Ts4 ends. A reset period Tr4 thus begins from the first row in which the sustain (light emitting) period Ts4 is complete. The length of an erasure period Te4 at this point normally becomes the length from the end of the sustain (light emitting) period of the first row, up until the address (write-in) period of the last row is complete, as shown in FIG. 11.

An address (write-in) period Ta5 of the subframe period SF5 then begins. One frame period is complete when the subframe periods SF5 and SF6 are complete, and the next frame period begins.

Figure 10A:
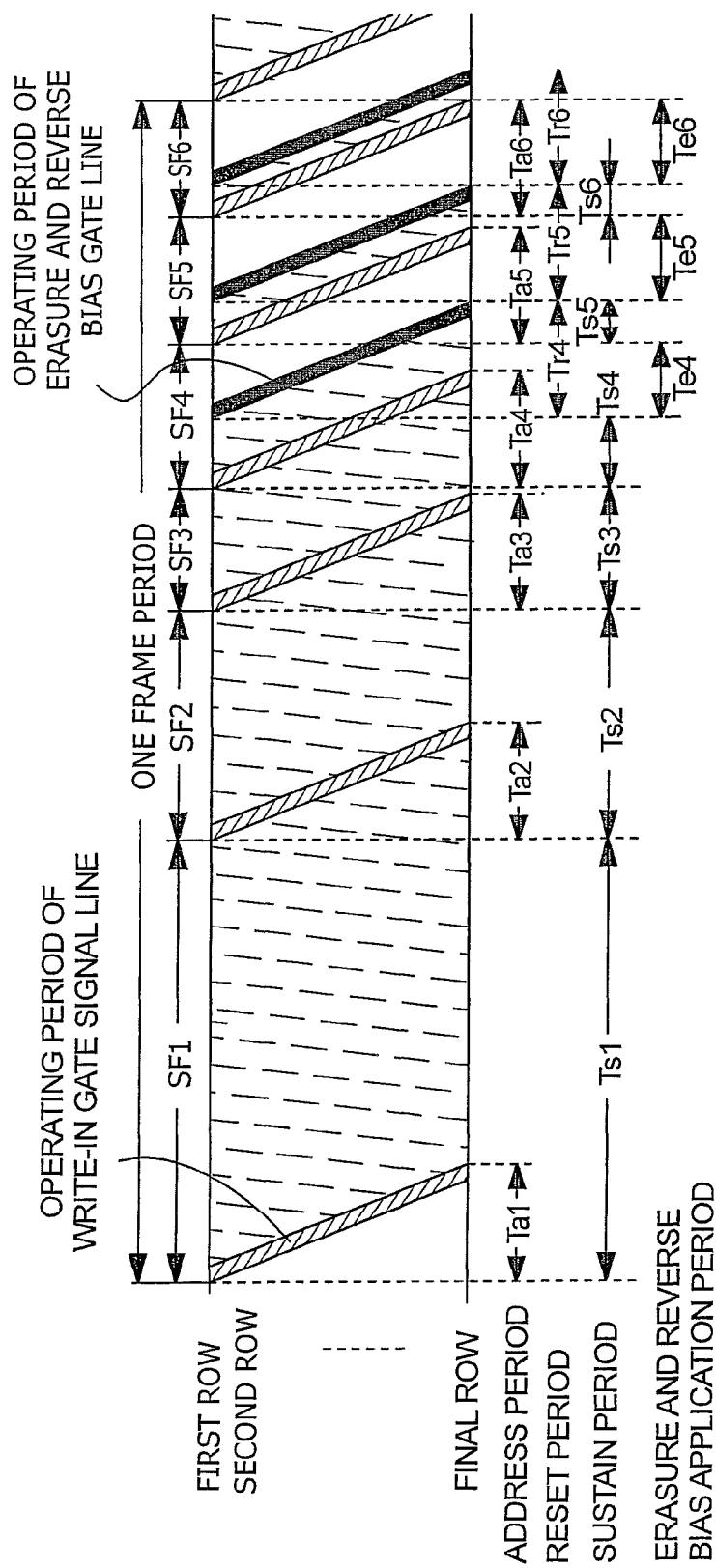
FIGS. 10A to 10C are diagrams showing SES drive timing charts in which a reverse bias period is prepared.

Operation timing for the circuits shown in embodiment modes 1 to 4 is explained next by using FIGS. 10A to 10C.

One frame period is divided into six subframe periods. Each subframe period has an address (write-in) period Ta and a sustain (light emitting) period Ts. Further, subframe period in which the address (write-in) period is longer than the sustain (light emitting) period (corresponding to the subframe periods SF4, SF5, and SF6 here) also have a reset period Tr, an erasure period Te, a reverse bias period Tb, and a reverse bias application period Ti in addition to the address (write-in) period Ta and the sustain (light emitting) period Ts.

The address (write-in) period is a period for writing a digital image signal into the pixels, and the sustain (light emitting) period Ts is a period during which the EL elements are placed in a light emitting state, or a non-light emitting state, based on the digital image signal written in during the address (write-in) period. The amount of time for which each pixel emits light per single frame period is determined by the subframe periods wherein each pixel emits light, and gray scale display is performed in accordance with this amount of light emission time.

The reset period Tr is a period during which a signal that forcibly places the EL elements in a non-light emitting state is input to the pixels. The erasure period Tr is a period during which the EL elements continue in the non-light emitting state based on the signal input during the reset period. Further, the reverse bias period Tb is a period in which a signal is input to the pixels for applying a reverse bias to the EL elements, and the reverse bias application period Ti is a period in which the reverse bias continues to be applied to the EL element based on the signal input during the reverse bias period Tb.

For the operation, pulses are input in order from a first write-in gate signal line during an address (write-in) period Ta1 of the subframe period SF1, and a digital image signal output to a source signal line is written in. Operation immediately shifts to a sustain (light emitting) period Ts1 for rows into which the digital image signal has been written. The address (write-in) period Ta1 is complete when write-in operation from a first row to a last row are complete. Pulses are next input to the write-in gate signal lines from the first row, in which the sustain (light emitting) period Ta1 is complete, and an address (write-in) period Ta2 of the subframe period SF2 begins.

The above operations are repeated, the subframe periods SF2 and SF3 are complete, and the address (write-in) period Ta4 of the subframe period SF4 begins. The address (write-in) period Ta4 is longer than the sustain (light emitting) period Ts4 here, and therefore the next address (write-in) period Ta5 cannot begin immediately after the sustain (light emitting) period Ts4 is complete. The reset period Tr4 therefore begins from the first row, in which the sustain (light emitting) period Ts4 is complete. The length of the erasure period Te4 at this point becomes the length of time from the end of the sustain (light emitting) period of the first row, to the end of the address (write-in) period of the last row, as shown in FIG. 10A.

The reverse bias period Tb4 begins at the same time as the reset period Tr4 at this point, the erasure period Te4 and the reverse bias application period become simultaneous periods, and a reverse bias is applied row by row. The address (write-in) period Ta5 of the subframe period SF5 then begins. One frame period is complete when the subframe periods SF5 and SF6 are complete, and operation continues with the next frame period.

Figure 10B:
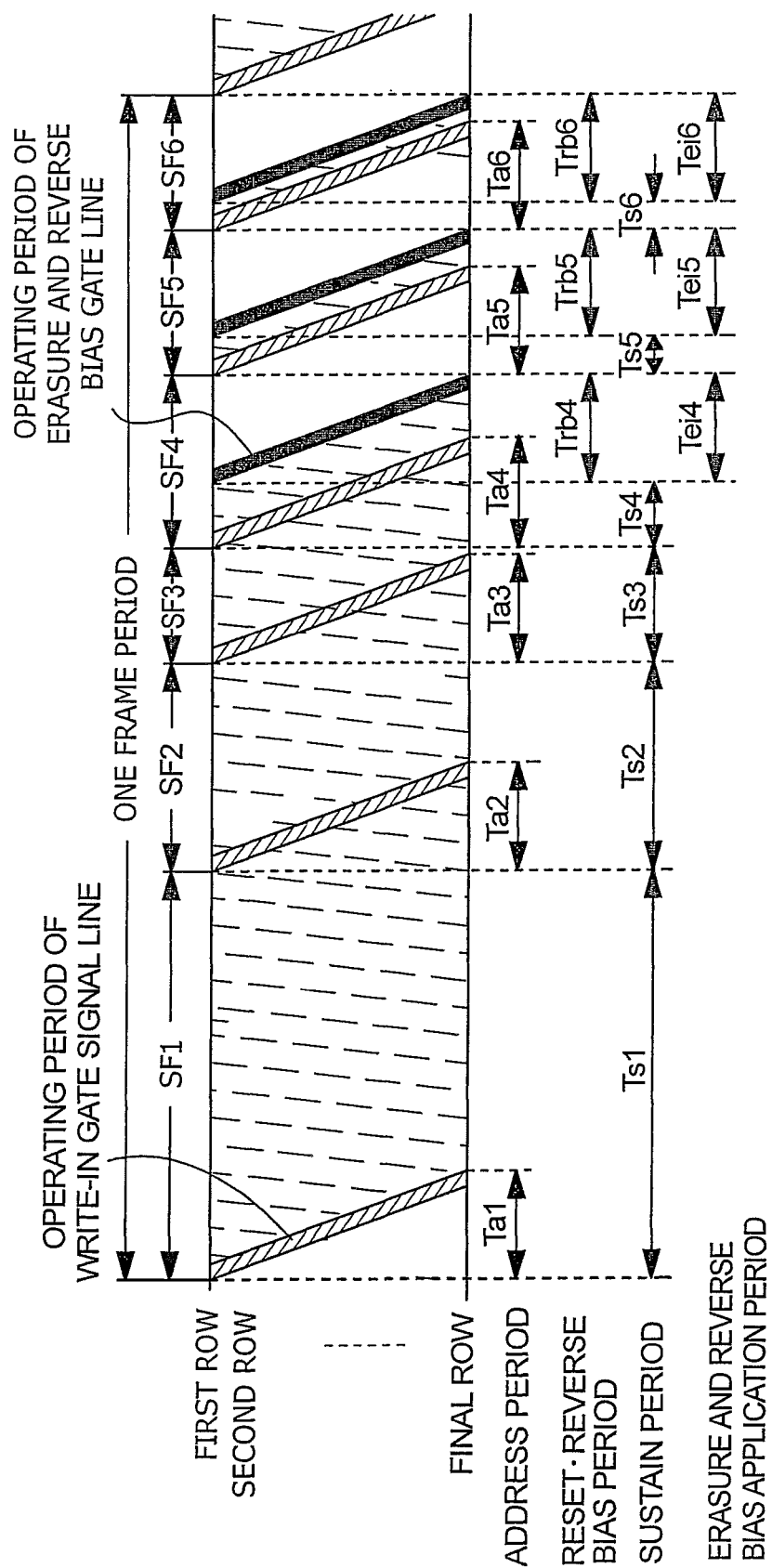

It is possible to regulate the amount of time for which the reverse bias is applied to the EL elements by arbitrarily extending the length of erasure and reverse bias application periods Tei4, Tei5, and Tei6, as shown by FIG. 10B.

Figure 10C:
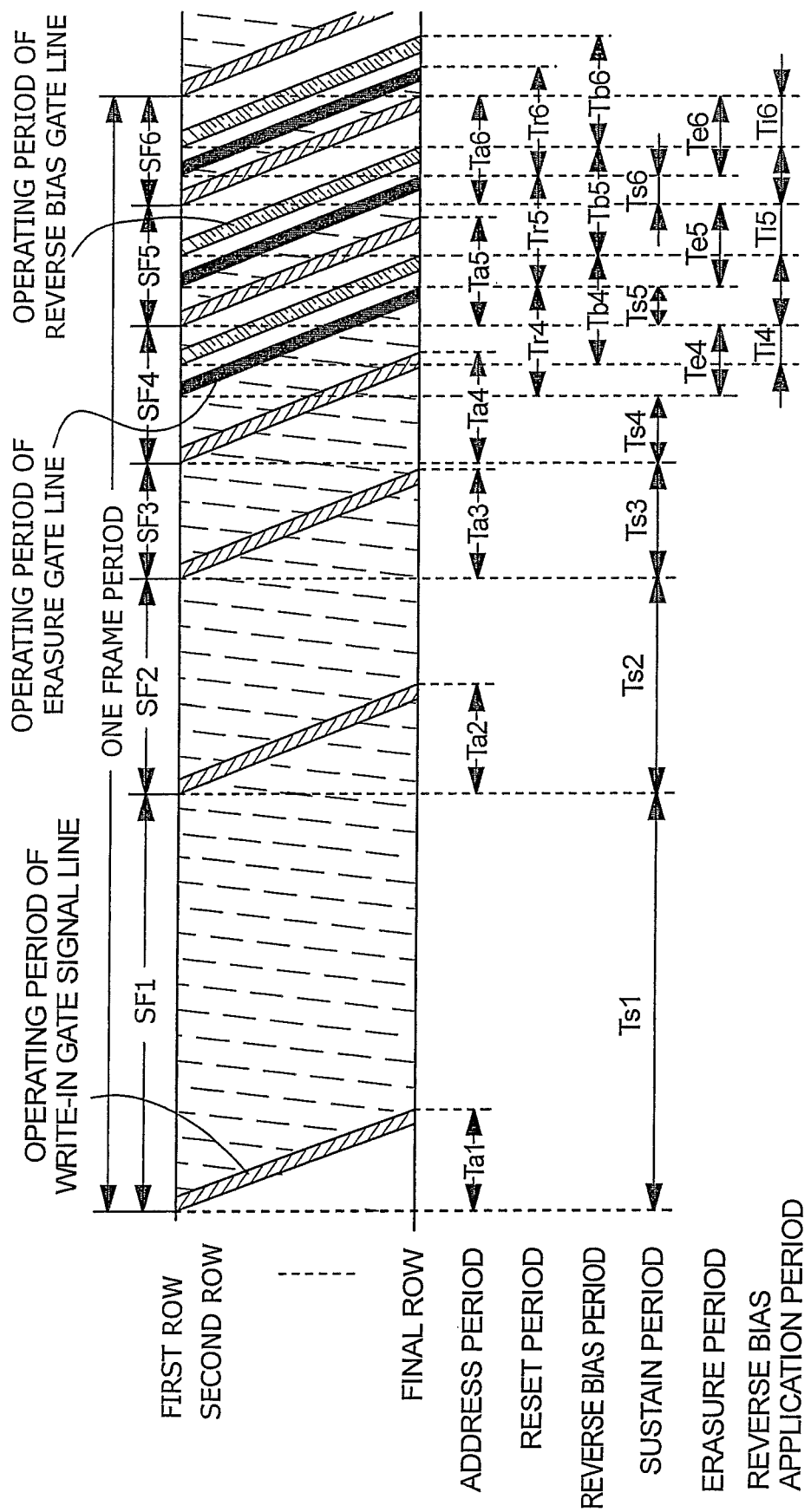

In addition, the reset period Tr4 and the reverse bias period Tb4 can also be made independent when employing embodiment mode 1 or embodiment mode 3 as shown in FIG. 10C. A reverse bias application period Ti4 is contained in the erasure period Te4, and can be arbitrarily set in a region that does not overlap with adjacent reverse bias periods Tb. It thus becomes possible to regulate the amount of time for which the reverse bias is applied to the EL elements.

Further, although an example which has the reset period Tr, the erasure period Te, the reverse bias period Tb, and the reverse bias application period Ti only in subframe periods wherein the address (write-in) period Ta is longer than the sustain (light emitting) period Ts here, it is also possible to prepare each of the periods, and apply a reverse bias to the EL elements, in subframe periods wherein the address (write-in) period Ta is shorter than the sustain (light emitting) period Ts, and wherein the both periods have the same length.

Furthermore, the number of subframe period divisions may be increased if it is desired to increase the number of display gray scales, and it is not always necessary for the order of the subframe periods to be from the most significant bit to the least significant bit. The subframe periods may appear randomly within one frame period.

Embodiment 4

Figure 5A:
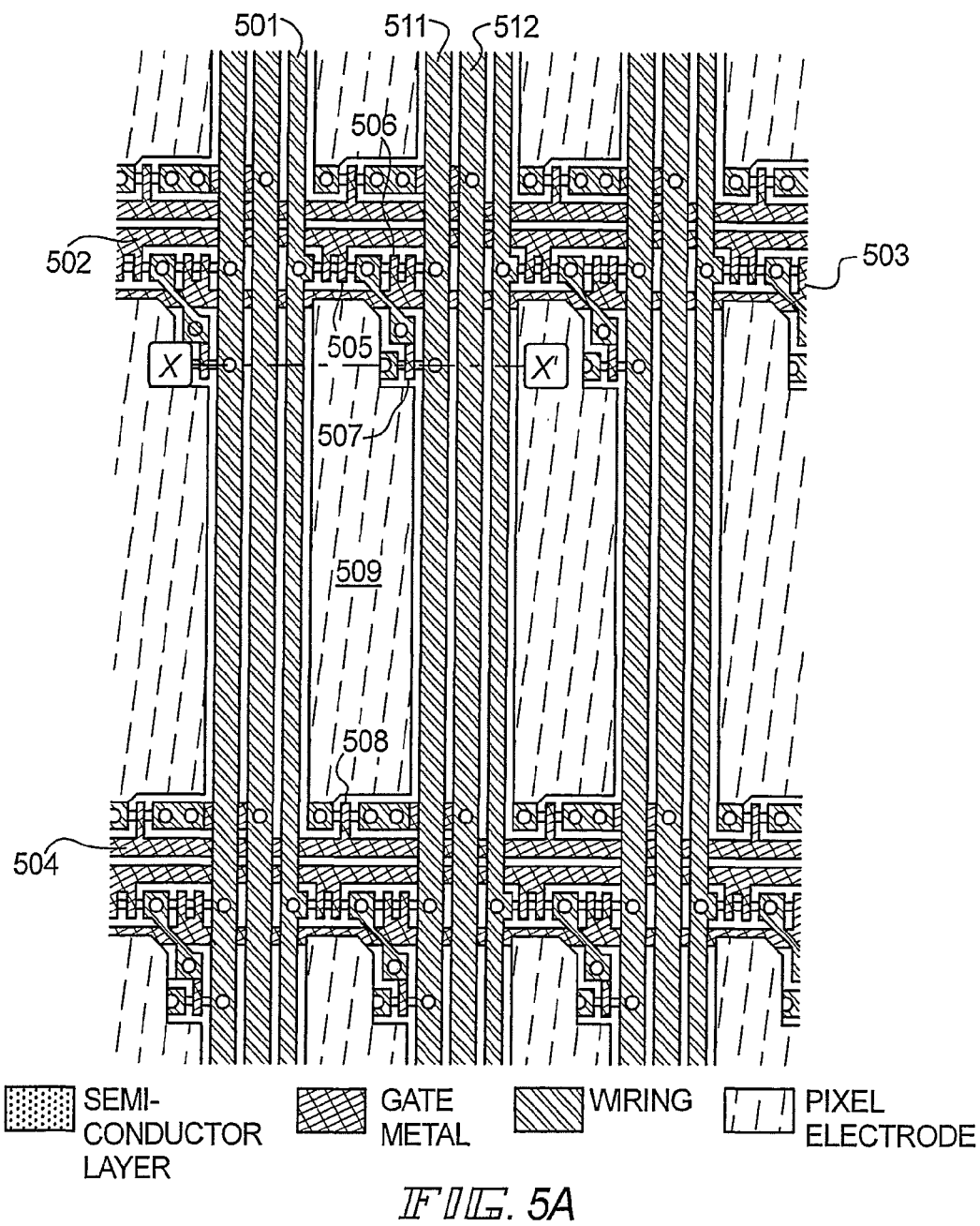
FIGS. 5A and 5B are a layout example and a cross sectional diagram, respectively, of a pixel portion of a light emitting element manufactured by applying the present invention.

An element layout example for a case of actually manufacturing a pixel having the structure of FIGS. 1A to 1E and disclosed in embodiment mode 1 is shown in FIG. 5A. Further, a cross sectional diagram of a portion denoted by a line segment X-X' in FIG. 5A is shown in FIG. 5B.

Figure 5B:
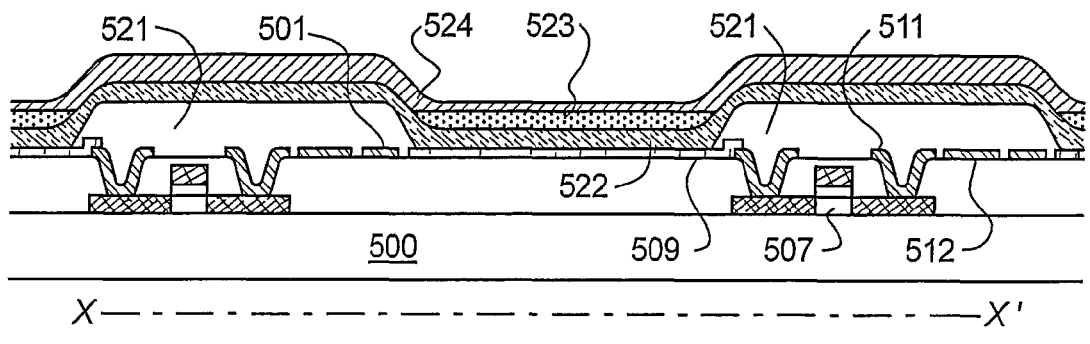

Reference numeral 500 in FIG. 5B denotes a substrate having an insulating surface. A driver TFT 507 and the like are formed on the substrate 500, and source and drain electrodes are formed by using a wiring material in order to provide connections to an impurity region for forming a source region and a drain region of the driver TFT 507. One of the electrodes, the source electrode or the drain electrode, is formed so as to make a connection with a pixel electrode 509 at an overlapping portion. An organic conductive film 522 is formed on the pixel electrode 509, and in addition, an organic thin film (light emitting layer) 523 is formed. An opposing electrode 524 is formed on the organic thin film (light emitting layer) 523. The opposing electrode 524 is formed with a shape covering the entire pixel in order to have a common connection.

The term EL element as used within this specification corresponds to a laminate of the pixel electrode 509, the organic conductive film 522, the organic thin film (light emitting layer) 523, and the opposing electrode 524 in FIG. 5B, and one electrode, the pixel electrode 509 or the opposing electrode 524, becomes an anode, while the other electrode becomes a cathode.

Light emitted from the organic thin film (light emitting layer) 523 passes through either the pixel electrode 509 or the opposing electrode 524 and is emitted. Cases in which light is emitted to the pixel electrode side, namely the side on which the TFTs and the like are formed, is referred to as lower surface emission, while cases in which light is emitted to the opposing electrode side is referred to as upper surface emission.

The pixel electrode 509 is formed by using a transparent conductive film for lower surface emission. Conversely, the opposing electrode 524 is formed by using a transparent conductive film for upper surface emission.

Note that the structure shown in embodiment 4 is only an example, and the pixel layout, the cross sectional structure, the lamination order of the EL element electrodes and the like are not limited to this example.

Further, EL elements possessing R, G, and B color light emission may be formed by being painted separately in a color display light emitting device, or a single color EL element may be formed over the entire pixel, and R, G, and B color light emission may be obtained by using color filters.

Embodiment 5

The results of measurements made relating to deterioration of brightness when performing direct current drive (forward bias always applied) and alternating current drive (forward bias and reverse bias alternately applied at a fixed period) in a light emitting device that applies a high molecular weight compound as a light emitting layer, and has a buffer layer formed from a conductive high molecular weight compound between an anode and a light emitting layer, are discussed in embodiment 5.

Figure 14A:
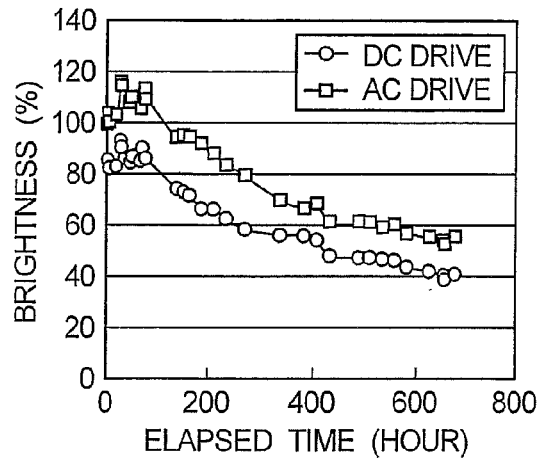
FIGS. 14A to 14D are diagrams showing the results of reliability experiments in direct current drive and alternating current drive.
Figure 14C:
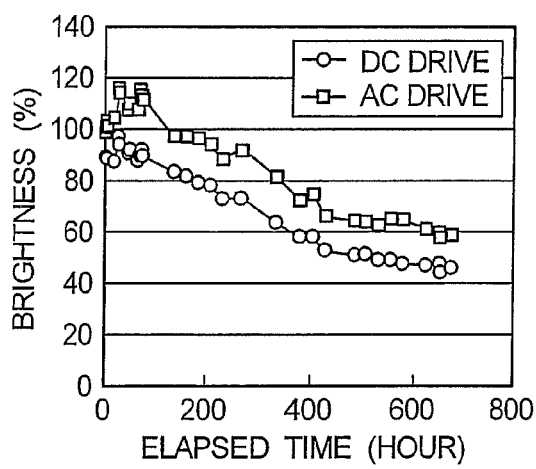
Figure 14B:
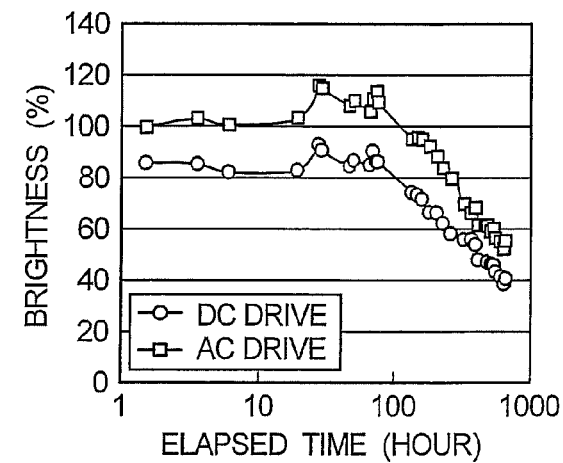

FIGS. 14A and 14B show the results or reliability experiments when performing alternating current drive with a forward bias of 3.7 V, a reverse bias of 1.7 V, a duty of 50%, and a frequency of 60 Hz. The initial brightness was approximately 400 cd/cm$^2$. Results are also shown for comparison performed by direct current drive (forward bias of 3.65 V). The brightness drops by one-half in direct current drive after a time on the order of 400 hours, while the one-half point is not reached even after approximately 700 hours have passed during alternating current drive.

Figure 14D:
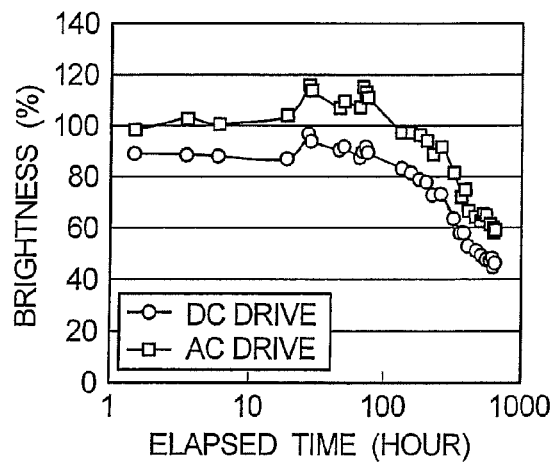

FIGS. 14C and 14D show the results or reliability experiments when performing alternating current drive with a forward bias of 3.8 V, a reverse bias of 1.7 V, a duty of 50%, and a frequency of 600 Hz. The initial brightness was approximately 300 cd/cm$^2$. Results are also shown for comparison performed by direct current drive (forward bias of 3.65 V). The brightness drops by one-half in direct current drive after a time on the order of 500 hours, while a brightness on the order of 60% of the initial brightness is maintained even after approximately 700 hours have passed during alternating current drive.

Embodiment 6

The light-emitting device utilizing the light emitting element is of self-emission type, and thus exhibits more excellent recognizability of the displayed image in a light place and has a wider viewing angle as compared to the liquid crystal display device. Accordingly, the light-emitting device can be applied to a display portion in various electronic devices.

Such electronic devices using a light-emitting device of the present invention include a video camera, a digital camera, a goggles-type display (head mount display), a navigation system, a sound reproduction device (such as a car audio equipment and an audio set), a lap-top computer, a game machine, a portable information terminal (such as a mobile computer, a cellular phone, a portable game machine, and an electronic book), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 13A to 13E respectively shows various specific examples of such electronic devices.

Figure 13A:
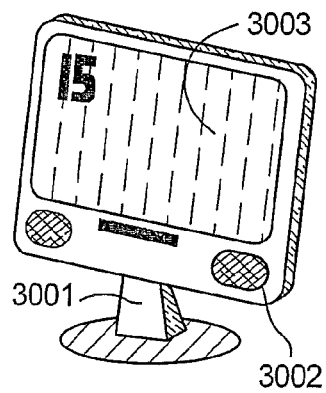
FIGS. 13A to 13E are diagrams showing examples of electronic devices capable of applying the present invention.

FIG. 13A illustrates an electro-luminescence display device which includes a casing 3001, an audio output portion 3002, a display portion 3003 and the like. The light emitting device of the present invention is applicable to the display portion 3003. The light-emitting device is of the self-emission-type and therefore requires no backlight. Thus, the display portion thereof can have a thickness thinner than that of a liquid crystal display device. The light-emitting device is including the entire display device for displaying information, such as a personal computer, a receiver of TV broadcasting and an advertising display.

Figure 13B:
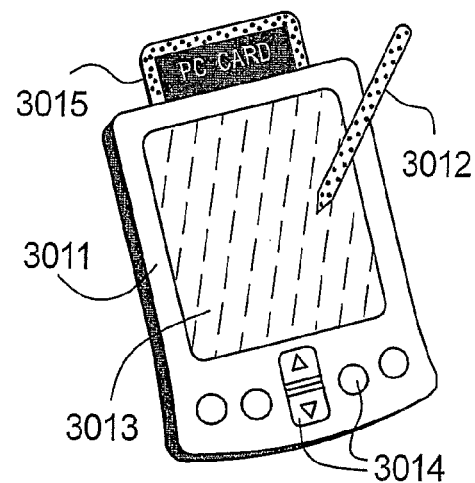
Figure 13C:
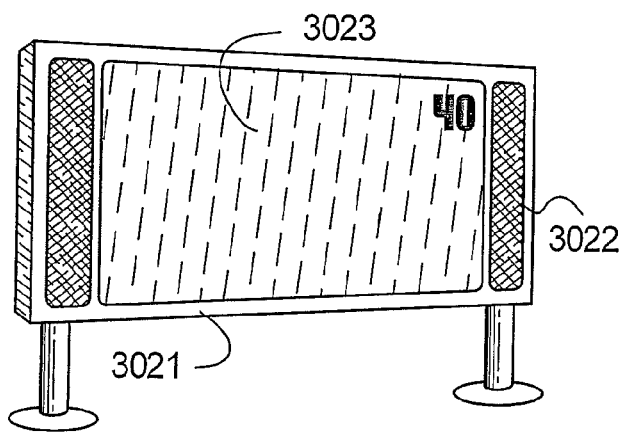

Further, FIG. 13C illustrates a large screen EL display which includes, same as FIG. 13A, a casing 3021, an audio output portion 3022 and a display portion 3023. The light emitting device of the present invention is applicable to the display portion 3023.

FIG. 13B illustrates a mobile computer which includes a main body 3011, a styles 3012, a display portion 3013, operation switches 3014, a interface 3015 and the like. The light emitting device of the present invention is applicable to the display portion 3013.

Figure 13D:
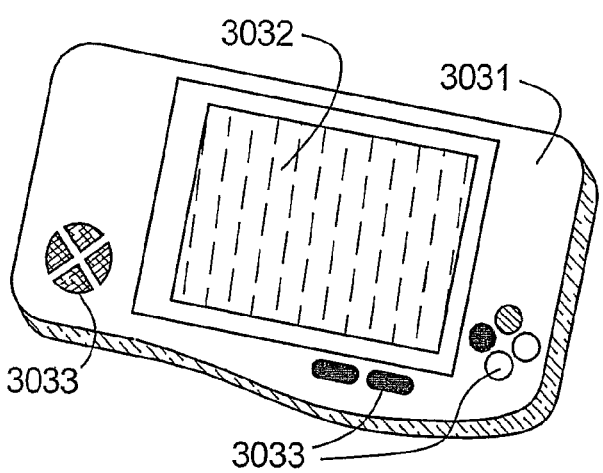

FIG. 13D illustrates a game machine which includes a main body 3031, a display portion 3032, operation switches 3033 and the like. The light emitting device of the present invention is applicable to the display portion 3032.

Figure 13E:
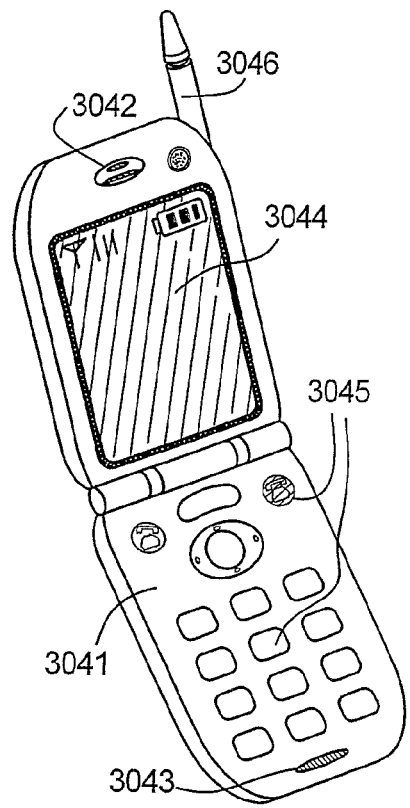

FIG. 13E illustrates a cellular phone which includes a main body 3041, an audio output portion 3042, an audio input 3043, a display portion 3044, operation switches 3045, an antenna 3046 and the like. The light emitting device of the present invention is applicable to the display portion 3044. Note that the display portion 3044 can reduce power consumption of the cellular phone by displaying white-colored characters on a black-colored background.

When brighter luminance of light emitted from the organic light-emitting material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic light-emitting material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a cellular phone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. Moreover, the electronic device in this embodiment can be implemented by using any structure of the light-emitting devices in Embodiments 1 to 5.

It becomes possible to apply a reverse bias to an EL element, without a need to change the electric potential of a pixel electrode or an opposing electrode, by using the light emitting device of the present invention. In addition, a reverse bias can be applied row by row, without creating a state in which the reverse bias is applied to all pixels within a surface simultaneously, by changing the electric potential of an electric power source line, and therefore a reverse bias period can be prepared in synchronous with an erasure period in SES drive. The reverse bias period can therefore be prepared without preparing a new period, which invites a reduction in the duty ratio. This contributes to giving EL elements longer life.

In addition, the reverse bias voltage can be made smaller than the forward bias voltage, and it is not necessary to greatly increase the voltage of an electric power source of a gate signal line driver circuit, and this is advantageous from a standpoint of reduced electric power consumption.

What is claimed is:

1. A light emitting device comprising:
  a pixel comprising:
    a source signal line;
    a gate signal line;
    a first transistor;
    a second transistor;
    a first electric power source line;
    an electroluminescence element;
    a third transistor; and
    a second electric power source line,
  wherein a gate of the first transistor is electrically connected to the gate signal line,
  wherein one of a source and a drain of the first transistor is electrically connected to the source signal line,
  wherein a gate of the second transistor is electrically connected to the other of the source and the drain of the first transistor,
  wherein one of a source and a drain of the second transistor is directly connected to the electroluminescence element,
  wherein the other of the source and the drain of the second transistor is electrically connected to the first electric power source line,
  wherein on of a source and a drain of the third transistor is directly connected to the electroluminescence element,
  wherein the other of the source and the drain of the third transistor is electrically connected to the second electric power source line, and
  wherein the first electric power source line is arranged parallel to the second electric power source line.

2. A light emitting device comprising:
  a pixel comprising:
    a source signal line;
    a gate signal line;
    a first transistor;
    a second transistor;
    a first electric power source line;
    an electroluminescence element;
    a third transistor; and
    a second electric power source line,
  wherein a gate of the first transistor is electrically connected to the gate signal line,
  wherein one of a source and a drain of the first transistor is electrically connected to the source signal line, wherein a gate of the second transistor is electrically connected to the other of the source and the drain of the first transistor,
wherein one of a source and a drain of the second transistor is directly connected to the electroluminescence element,
wherein the other of the source and the drain of the second transistor is electrically connected to the first electric power source line,
wherein on of a source and a drain of the third transistor is directly connected to the electroluminescence element,
wherein the other of the source and the drain of the third transistor is electrically connected to the second electric power source line, and
wherein the first electric power source line is arranged parallel to the second electric power source line and the source signal line.

3. The light emitting device according to claim 1, wherein the first transistor is a switching transistor.

4. The light emitting device according to claim 2, wherein the first transistor is a switching transistor.

5. The light emitting device according to claim 1, wherein the second transistor is a driver transistor.

6. The light emitting device according to claim 2, wherein the second transistor is a driver transistor.

7. The light emitting device according to claim 1, wherein the third transistor is a reverse bias transistor.

8. The light emitting device according to claim 2, wherein the third transistor is a reverse bias transistor.

9. The light emitting device according to claim 1, wherein an electric potential of the first electric power source line is different from that of the second electric power source line.

10. The light emitting device according to claim 2, wherein an electric potential of the first electric power source line is different from that of the second electric power source line.

11. The light emitting device according to claim 1, further comprising:
a fourth transistor electrically connected to the first transistor, the second transistor and the first electric power source line.

12. The light emitting device according to claim 2, further comprising:
a fourth transistor electrically connected to the first transistor, the second transistor and the first electric power source line.

13. The light emitting device according to claim 1, wherein the first electric power source line is an electric current supply line.

14. The light emitting device according to claim 2, wherein the first electric power source line is an electric current supply line.

15. The light emitting device according to claim 1, wherein the second electric power source line is a reverse bias electric power source line.

16. The light emitting device according to claim 2 wherein the second electric power source line is a reverse bias electric power source line.

* * * * *